(12) United States Patent
Tsuji et al.

(10) Patent No.: US 8,399,794 B2
(45) Date of Patent: Mar. 19, 2013

(54) ATMOSPHERIC PRESSURE PLASMA, GENERATING METHOD, PLASMA PROCESSING METHOD AND COMPONENT MOUNTING METHOD USING SAME, AND DEVICE USING THESE METHODS

(75) Inventors: Hiroyuki Tsuji, Kyoto (JP); Kazuhiro Inoue, Osaka (JP)

(73) Assignee: Panasonic Corporation, Osaka (JP)

( * ) Notice: Subject to any disclaimer, the term of this patent is extended or adjusted under 35 U.S.C. 154(b) by 1174 days.

(21) Appl. No.: 12/299,174

(22) PCT Filed: May 28, 2007

(86) PCT No.: PCT/JP2007/061241
§ 371 (c)(1),
(2), (4) Date: Oct. 31, 2008

(87) PCT Pub. No.: WO2007/142166
PCT Pub. Date: Dec. 13, 2007

(65) Prior Publication Data
US 2009/0186167 A1 Jul. 23, 2009

(30) Foreign Application Priority Data

May 30, 2006 (JP) ................................. 2006-149084
Jul. 25, 2006 (JP) ................................. 2006-201562
Aug. 17, 2006 (JP) ................................. 2006-222741

(51) Int. Cl.
*B23K 10/00* (2006.01)
(52) U.S. Cl. ......... 219/121.36; 219/121.43; 219/121.59; 118/723 R; 156/345.34; 156/345.43

(58) Field of Classification Search ............. 219/121.36, 219/121.4, 121.43, 121.59, 121.41; 118/723 R; 156/345.34, 345.43
See application file for complete search history.

(56) References Cited

U.S. PATENT DOCUMENTS
(Continued)

FOREIGN PATENT DOCUMENTS

| CN | 1221967 | 7/1999 |
|---|---|---|
| CN | 1411920 | 4/2003 |

(Continued)

OTHER PUBLICATIONS

China Office action that issued with respect to patent family member Chinese Patent Application No. 200780019833.0, dated Aug. 24, 2011 along with an english translation thereof.

(Continued)

*Primary Examiner* — Mark Paschall
(74) *Attorney, Agent, or Firm* — Greenblum & Bernstein, P.L.C.

(57) ABSTRACT

A first inert gas (5) is supplied into a reaction space (1) and a high-frequency power supply (4) applies a high-frequency electric field so that a primary plasma (6) composed of the first inert gas which has been made into the plasma is ejected from the reaction space. A mixed gas area (10) in which a mixed gas (8) having a second inert gas (12) as a main ingredient and a proper amount of a reactive gas (13) mixed is formed. The primary plasma collides into the mixed gas area to generate a secondary plasma (11) composed of the mixed gas which has been made into the plasma, and the secondary plasma is sprayed on a processed object (S) to carry out a plasma processing. Accordingly, the plasma processing is carried out in a wide range by an atmospheric pressure plasma generated by a small input power.

4 Claims, 21 Drawing Sheets

U.S. PATENT DOCUMENTS

| | | | |
|---|---|---|---|
| 5,788,868 A * | 8/1998 | Itaba et al. | 216/41 |
| 6,100,496 A | 8/2000 | Takuya et al. | |
| 6,429,400 B1 | 8/2002 | Sawada et al. | |
| 2003/0098367 A1 | 5/2003 | Freshour et al. | |
| 2003/0136518 A1 | 7/2003 | Shanov et al. | |
| 2004/0084148 A1 | 5/2004 | Sasaoka et al. | |
| 2004/0091642 A1 * | 5/2004 | Murakami et al. | 428/1.31 |
| 2004/0154541 A1 | 8/2004 | Colpo et al. | |
| 2004/0157447 A1 | 8/2004 | Okumura et al. | |
| 2006/0269672 A1 | 11/2006 | Gambino et al. | |

FOREIGN PATENT DOCUMENTS

| | | |
|---|---|---|
| CN | 1460289 | 12/2003 |
| EP | 1253216 | 10/2002 |
| EP | 1300877 | 4/2003 |
| JP | 9-059777 A | 3/1997 |
| JP | 11-251304 A | 9/1999 |
| JP | 2002-001253 A | 1/2002 |
| JP | 2002-028597 A | 1/2002 |
| JP | 2002-110613 | 4/2002 |
| JP | 2003-049272 A | 2/2003 |
| JP | 2003-133717 | 5/2003 |
| JP | 2003-167526 A | 6/2003 |
| JP | 3616088 B1 | 11/2004 |
| JP | 2005-329353 | 12/2005 |
| WO | 03/056601 | 7/2003 |

OTHER PUBLICATIONS

English language Abstract of JP 2002-001253 A.
English language Abstract of JP 9-059777 A.
English language Abstract of JP 2003-049272 A.
English language Abstract of JP 11-251304 A.
English language Abstract of JP 2002-028597 A.
English language Abstract of JP 2003-167526 A.
English language Abstract of JP 2005-267975 A.
China Office action that issued with respect to patent family member Chinese Patent Application No. 200780019833.0, mail date is Jan. 19, 2011 and English language translation.

* cited by examiner

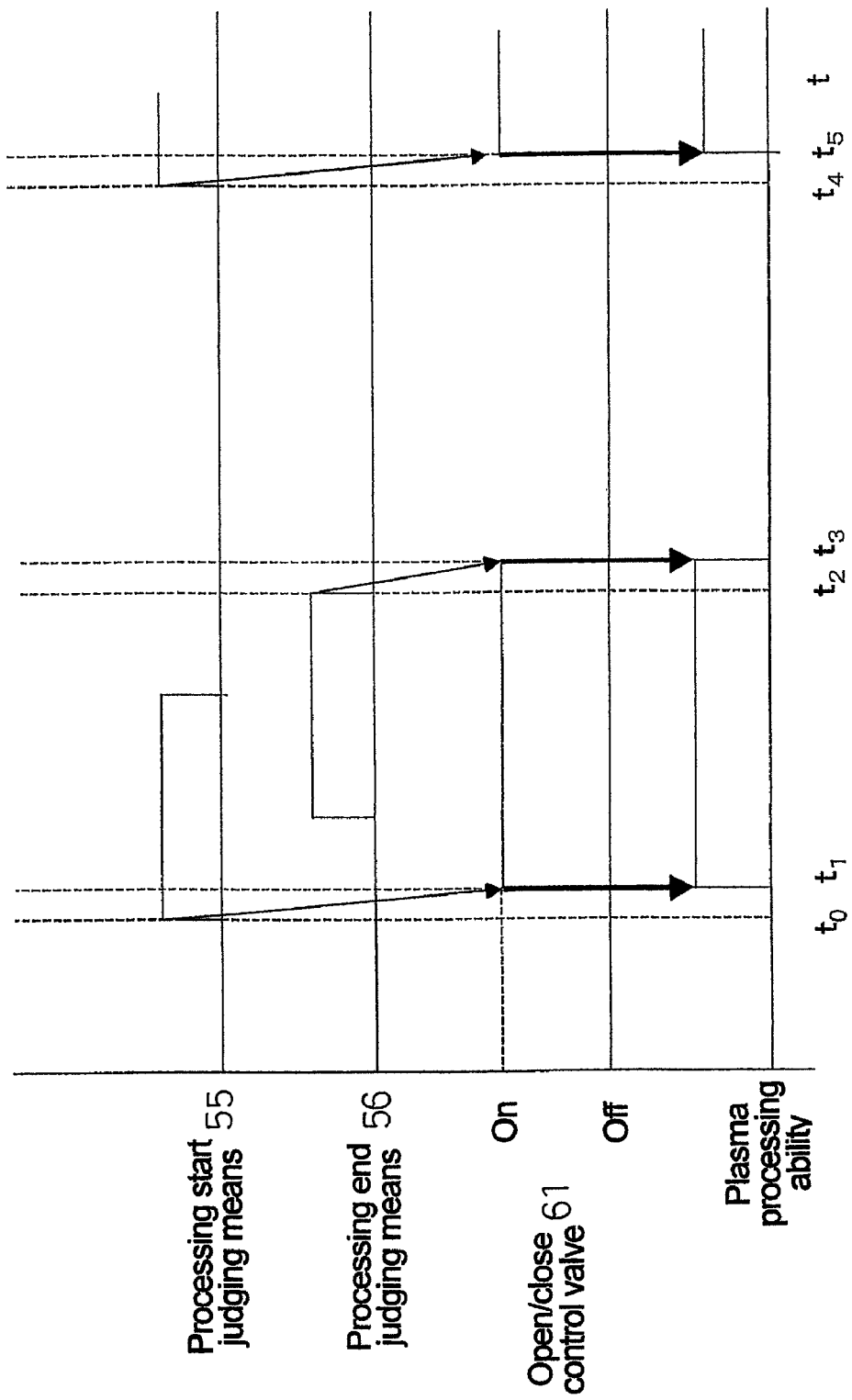

US 8,399,794 B2

ATMOSPHERIC PRESSURE PLASMA, GENERATING METHOD, PLASMA PROCESSING METHOD AND COMPONENT MOUNTING METHOD USING SAME, AND DEVICE USING THESE METHODS

TECHNICAL FIELD

The present invention relates to a method for generating an atmospheric pressure plasma which carries out a plasma processing in a wide range with small input power, a processing method and a component mounting method by the generated atmospheric pressure plasma, and a device using these methods.

BACKGROUND ART

Conventionally, there is known an atmospheric pressure plasma generating device which makes an inert gas into a plasma in the vicinity of atmospheric pressures (in a range of 500 to 1500 mmHg in terms of pressure) and makes a reactive gas into a plasma by the generated radicals of the inert gas to carry out a plasma processing such as surface reforming, etching, and deposition. In such an atmospheric pressure plasma generating device, the inert gas and the reactive gas mixed at a predetermined ratio in advance are provided to one end of a cylindrical reaction vessel. Applying a high-frequency electric field to the reaction vessel makes the mixed gas into a plasma and the generated plasma ejected from the other end of the reaction vessel is subjected to a processed object to carry out the processing.

With reference to FIG. 21, the principle of plasma generation will be described in the case of using argon serving as the inert gas and oxygen serving as the reactive gas. Applying the high-frequency electric field, an Ar atom (Ar) in a reaction space in which a discharge plasma is generated is excited or ionized by an electron (e) in the discharge plasma and becomes an argon radical (Ar*), an argon ion (Ar$^+$), or an electron (e). The argon radical (Ar*) being in a metastable state with high energy reacts with the same or different kind of atom in the vicinity thereof in order to return to a stable state by making that atom excited or ionized, so that that reaction occurs with an avalanche multiplication. If there is the oxygen in the vicinity thereof at that time, an oxygen atom (O) is excited or ionized and becomes an oxygen radical (O*), an oxygen ion (O$^+$), or an electron (e). The oxygen radical (O*) reacts with a material in the surface of a processed object and carries out a plasma processing such as surface reforming and removing organic matter by reacting with the organic matter in the surface. The radical of the inert gas maintains the metastable state for a longer time in comparison with the radical of the reactive gas, and hence the inert gas is used for generating the plasma in general. Using a gas for deposition as the reactive gas can achieve deposition. Using hydrogen can expect reduction operation.

A conventional example 1 according to an atmospheric pressure plasma generating device, as shown in FIG. 22, includes a reaction vessel 101 for forming a reaction space, a pair of electrodes 103a and 103b disposed in the outside periphery of the reaction vessel 101 with an interval in an axial direction, and a high-frequency power supply 104 for applying alternating or pulse-shaped high-frequency voltages between the pair of electrodes 103a and 103b. A mixed gas 102 into which the inert gas and the reactive gas are mixed at a predetermined ratio is supplied from one end of the reaction vessel 101, and the alternating or pulse-shaped high-frequency voltage is applied between the pair of electrodes 103a and 103b. Thus, a plasma is generated in the reaction space and the generated plasma 105 is ejected from the other end of the reaction vessel 101. Applying the plasma 105 on the surface of a processed object 106 can carry out a plasma processing (refer to Japanese Patent Laid-Open Publication No. 2002-1253).

In the structure shown in FIG. 22, it needs dozens of times of input power to excite the mixed gas into which the inert gas and the reactive gas are mixed and make the reactive gas into a plasma as compared with a case of exciting only the inert gas, so that there is the problem in which a device becomes large. As the principle of plasma generation solving such a problem, as shown in FIG. 23, it is proposed that only an inert gas (Ar in the drawing) 113 is supplied to a reaction vessel 111 to which a high-frequency power supply 112 applies a high-frequency electric field and a reactive gas (O$_2$ gas in the drawing) 116 is supplied from a reactive gas supply pipe 115 to the plasma 114 ejected from the reaction vessel 111. In a conventional example 2 embodying the principle of plasma generation, as shown in FIG. 24, the plasma 114 ejected from the reaction vessel 111 is sprayed from one side of a processed object 117 and the reactive gas 116 is sprayed from the other side of the processed object 117 through the reactive gas supply pipe 115 (refer to Japanese Patent Laid-Open Publication No. Hei 9-59777).

Furthermore, as shown in FIG. 25, the following configuration is known as a conventional example 3. A reactive gas supply space 121 is disposed in the middle and a pair of reaction spaces 122 and 123 to which an inert gas is supplied and a high-frequency power supply 124 applies a high-frequency electric field is disposed on both sides thereof. The reactive gas passes through the excited inert gas to mix it with the inert gas, and the reactive gas made into a plasma carries out a plasma processing on a processed object 125 (refer to Japanese Patent Laid-Open Publication No. 2003-49272).

Also the following is known as a device which carries out a plasma processing by an atmospheric pressure plasma. The device is provided with a plasma head which generates an atmospheric pressure plasma and ejects a plasma jet from an outlet and moving means which relatively moves a processed object and the plasma head so as to face the plasma head to a particular processed portion of the processed object. A plasma processing is carried out by spraying the plasma jet on the particular processed portion of the processed object (refer to Japanese Patent Laid-Open Publication No. Hei 11-251304).

A device shown in FIGS. 26A and 26B is known as a conventional example 4 related to a method and device for mounting a component on a substrate. The conventional example 4 uses a plasma head 131 which is provided with a cylindrical reaction space 132 and a pair of electrodes 133 and 134 disposed inside and outside of the reaction space 132. The plasma head 131 applies a high-frequency voltage between the electrodes 133 and 134 while supplying an inert gas 135 from an upper end of the reaction space 132, so that a plasma is generated in the reaction space 132 and a plasma jet 136 is ejected from a lower end 132a of the reaction space 132. The plasma head 131 is relatively moved to a table 138 on which a panel 137 for a flat panel display is fixed as an arrow 'a' in order to carry out a plasma processing on a connection electrode component 139 which is composed of transparent electrodes 139a formed in parallel at a side end of the panel 137 (refer to Japanese Patent Laid-Open Publication No. 2002-28597).

It is also known to carry out a plasma processing in a like manner by using a plasma head having the structure shown in FIG. 22 (refer to Japanese Patent Laid-Open Publication No.

2003-167526). A compact micro plasma jet generating device for generating a micro inductively coupled plasma jet under an atmospheric pressure is also proposed (refer to the description of Japanese Patent No. 3616088).

However, the structure shown in FIG. 22 has the problem that large input power is necessary to generate a plasma as described above and the device become large. In addition to this, the lifetime of the reactive gas which is made into a plasma is short and the plasma 105 disappears immediately after being ejected from the other end of the reaction vessel 101. Thus, the reactive gas made into a plasma does not work effectively unless the distance L between the other end of the reaction vessel 101 and the processed object 106 is short, and hence there is the problem that the distance range of the plasma processing is limited to small.

In the structure shown in FIG. 24, since the excited reactive gas having a short lifetime disappears immediately after going out of the reaction vessel 111, it is impossible to make the reactive gas 116 into a plasma except in the vicinity of the outlet of the reaction vessel 111. Thus, there is the problem that the reactive gas 116 is not sufficiently made into a plasma. In the structure shown in FIG. 25, the reactive gas is easily mixed with the inert gas in comparison with the structure shown in FIG. 24 because the reactive gas is passed through the excited inert gas for mixture, and hence there is an advantage that a range in which the reactive gas is made into plasma becomes uniform. However, the lifetime of the inert gas is still short, and there is the problem that a distance range of the plasma processing is limited to small.

In the plasma processing method disclosed in the above Japanese Patent Laid-Open Publication No. Hei 11-251304, it is necessary to successively generate the plasma jet by keeping on supplying the mixed gas of the inert gas and the reactive gas or at least the inert gas not only during applying the plasma jet to the processed portion of the processed object but also during moving between the processed portions. This is because if the generation of the plasma jet is stopped once, it takes time to ignite a plasma again and generate a stable plasma jet and hence productivity is significantly reduced. Also a gas supplied until the plasma jet comes to be stable is wasted without contributing the plasma processing. Therefore, the amount of consumed gas is significantly increased in comparison with the case of vacuum plasma processing to an extent such as several liters per minute to several hundreds liters per minute. Also an expensive gas of high purity is necessary because a plasma becomes unstable if a gas of low purity is used for the atmospheric pressure plasma. As a result, there is the problem that running costs of the plasma processing become extremely high.

Also there is the problem that it is difficult to stably apply the plasma jet to the processed portion of the processed object and not to apply the plasma jet to a position except for the processed portion because the plasma jet is successively ejected. In other words, it is necessary to intricately control the relative movement between the plasma head and the processed object in order to get the stable application of the plasma jet to the processed portion and not to apply it at all to the position except for the processed portion. Accordingly, there is the problem that equipment and the structure of a control mechanism become sophisticated.

Furthermore, since the lifetime of the reactive gas made into a plasma is short within the plasma generated as described above, the plasma jet disappears immediately after being ejected from the outlet of the plasma head. Accordingly, the reactive gas made into a plasma does not effectively work without shortening the distance between the outlet of the plasma head and the processed object, so that there are the problems that the efficiency of the plasma processing deteriorates and movement control during the processing becomes complicated because the distance range of the plasma processing is limited to small.

In the plasma generating methods disclosed in the foregoing Japanese Patent Laid-Open Publications No. Hei 11-251304, No. 2002-28597, and No. 2003-167526, a capacitively coupled plasma (non-equilibrium plasma) is generated with the use of a pair of electrodes conforming to parallel plates, and the plasma density of the generated plasma is $10^{11}$ to $10^{12}/cm^3$ at the maximum. Since it takes much time to carry out the plasma processing on a component to-be-bonded portion of a substrate using such capacitively coupled plasma with low plasma density, it is impossible to adjust the plasma processing to the tact of the other processes of a component mounting process. Thus, it is necessary to carry out the plasma processing in a separate process from the component mounting process, and hence there is the problem that the productivity of component mounting is seriously reduced. When the plasma processing is carried out in the separate process, there is the problem that the plasma-processed portion is contaminated again during carrying the substrate from the plasma processing process to the component mounting process. Furthermore, it becomes impossible to incorporate the plasma processing into a component mounting line in actual fact since the size of the flat panel display is upsized and exceeds forty inches in recent years, though this is still possible in a case that the size of the flat panel display is a few inches. The plasma temperature of the capacitively coupled plasma is approximately several hundreds degrees centigrade and hence there is little fear of damaging the flat panel display by heat.

On the other hand, an inductively coupled plasma (thermal plasma) disclosed in the description of Japanese Patent No. 3616088 have a plasma density of $10^{16}$ to $10^{17}/cm^3$ and the density is approximately $10^5$ times higher than that of the capacitively coupled plasma. Thus, the inductively coupled plasma has high reactivity and high processing ability. However, the plasma temperature of the thermal plasma is several to ten thousands degrees centigrade, so that there is the problem that the thermal plasma damages a substrate by heat when the substrate to which the plasma is applied has a heat-sensitive portion. For example, in a liquid crystal panel manufacturing process in recent years, a substrate on which a polarizing plate has been already attached is supplied to a component mounting line to mount electronic components for driving liquid crystal. If a plasma processing process is incorporated into the mounting line, the plasma with high temperature affects and damages the polarizing plate, so that it is impossible to do so.

In light of the foregoing conventional problems, an object of the present invention is to provide a method and device for generating an atmospheric pressure plasma which generates an atmospheric pressure plasma with small input power. The use of the atmospheric pressure plasma achieves a plasma processing in a wide range in a perspective direction with respect to a reaction space in which the plasma is generated and in a planar direction.

Another object of the invention is to provide a method and device for plasma processing which stably and efficiently processes only a processed portion of a processed object with high productivity by simple structure and control at low costs.

Still another object of the invention is to provide a method and device for mounting a component on a substrate which efficiently carries out a plasma processing on a component to-be-bonded portion of a substrate without damaging it by heat and incorporates the plasma processing into a component mounting process.

DISCLOSURE OF THE INVENTION

To achieve the foregoing objects, a method for generating an atmospheric pressure plasma according to the present invention includes: a plasma generating step of supplying a first inert gas into a reaction space and applying a high-frequency electric field to eject a primary plasma composed of the first inert gas that has been made into the plasma from the reaction space; and a plasma expanding step of forming a mixed gas area which contains a second inert gas as a main ingredient and a proper amount of a reactive gas mixed therewith so that the primary plasma collides therewith in order to generate a secondary plasma composed of the mixed gas that has been made into the plasma.

Furthermore, an atmospheric pressure plasma generating device according to the present invention includes: a plasma generating section having a reaction space, first inert gas supply means for supplying a first inert gas into the reaction space, and a high-frequency power supply for applying a high-frequency electric field to the reaction space, the plasma generating section ejecting a primary plasma composed of the first inert gas that has been made into the plasma from the reaction space; and a plasma expanding section including a mixed gas area which contains a second inert gas as a main ingredient and a proper amount of a reactive gas mixed therewith so that the ejected primary plasma collides therewith, the section being for generating a secondary plasma composed of the mixed gas that has been made into the plasma.

The present invention has been completed based on the fact found through the diligent study about the method for generating an atmospheric pressure plasma by the present inventors, wherein when an inert gas was supplied toward a plasma ejected from a reaction space to collide the plasma with the inert gas, the supplied inert gas was made into a plasma with an avalanche multiplication and the plasma largely expands. Therefore, according to the method and device for generating an atmospheric pressure plasma of the present invention, the first inert gas is made into a plasma in the reaction space by applying the high-frequency electric field and is ejected as the primary plasma. The primary plasma collides into the mixed gas area of the second inert gas and the reactive gas so that the second inert gas with which the primary plasma collides is made into a plasma with the avalanche multiplication and expands to the whole mixed gas area. The reactive gas is made into a plasma by radicals of the second inert gas which has been made into the plasma, and hence the plasma expands in a wide range in a perspective direction and planar direction with respect to the reaction space and carries out a plasma processing. Also, the method and device need only small electric power because the high-frequency electric field is applied to only the reaction space where the primary plasma is generated. Since the input power is small, the temperature of the generated secondary plasma is low, so that there is an effect that it becomes possible to easily carry out the plasma processing on a substrate with low heat resistance such as a substrate on which a component with low heat resistance has been mounted and the like.

Different kinds of gases are available as the first inert gas and the second inert gas, but it is preferable to use the same kind of inert gas because the expansion of the secondary plasma becomes stable and gas supply means can be simplified. It is preferable to choose the first inert gas and the second inert gas from argon, helium, xenon, neon, nitrogen, krypton, and one or plurality kinds of mixed gas thereof.

A nitrogen gas is not an inert gas literally but behaves like an ordinary inert gas in generating the atmospheric pressure plasma and is available in a like manner. Thus, the examples of the present invention include nitrogen gas as the inert gas.

Mixed gas supply means for supplying a mixed gas, into which the second inert gas and the reactive gas have been mixed in advance, to the mixed gas area may be provided, and the mixed gas area is formed such that the mixed gas of the second inert gas and the reactive gas is supplied therein. In this configuration, the gas supply means is simplified in comparison with the case of separately supplying both the gases. Since the second inert gas and the reactive gas are evenly mixed, the secondary plasma is stably formed even in a wide area, so that it is possible to evenly carry out the plasma processing in a wide range.

Consider the case where the reactive gas is made of a hydrogen gas and the hydrogen gas is supplied as a mixed gas and is mixed with the second inert gas in a concentration of 4% or less. In this case, it is possible to safely carry out the plasma reduction processing by supplying the mixed gas without the risk of explosion, though using the hydrogen gas has the risk of explosion because it explodes when its concentration exceed 4%. Also, it is possible to efficiently carry out the processing in a wide range.

Second inert gas supply means for supplying the second inert gas to the mixed gas area and reactive gas supply means for supplying the reactive gas to the mixed gas area may be separately provided to form the mixed gas area so as to separately supply the second inert gas and the reactive gas to the area. In this case, the reactive gas can be mixed in an adjusted arbitrary concentration, and hence it is possible to carry out a plasma processing with a desired condition.

The second inert gas supply means is disposed outside the primary plasma ejected from the plasma generating section and the reactive gas supply means is disposed outside the second inert gas supply means in order to supply the second inert gas to the outside of the ejected primary plasma and to supply the reactive gas to the outside of a second inert gas supplied area. Since the primary plasma collides with an atmosphere of only the second inert gas, the plasma of the second inert gas efficiently expands to the whole of the second inert gas supply area. Mixing the reactive gas into the widely expanded secondary plasma and making it into the plasma achieves the plasma processing in a wider range.

One or a plurality of plasma generating sections may be disposed in a peripheral wall of a plasma tube that forms a plasma expanding space with a predetermined shape in cross section, from one end of which the mixed gas is supplied, in order to eject the primary plasma into the plasma expanding space. This makes it possible to eject the secondary plasma from the other end of the plasma expanding space. In this case, the secondary plasma can be ejected from an area corresponding to the shape and size of the cross section of the plasma tube, so that it is possible to carry out the plasma processing in a wider range at a time. For example, using a plasma tube having a slender cross section and relatively moving a processed object in a direction orthogonal to a longitudinal direction of the plasma tube make it possible to evenly and efficiently carry out the plasma processing on a large area.

Otherwise, a plasma generating section and a plasma expanding section may be provided. In the plasma generating section, a pair of electrodes is oppositely disposed with the reaction space interposed therebetween. The plasma generating section ejects the primary plasma from a plurality of openings provided in a surface in which one of the electrodes is disposed. The plasma expanding section is disposed adjacently to the plasma generating section in such a manner that the primary plasma is ejected therein. The mixed gas is supplied from one side, both sides, or a periphery of the plasma expanding section, and the secondary plasma is ejected from a plurality of openings provided in a side face opposite to the plasma generating section. In this case, it is possible to evenly carry out the plasma processing at a time on a large flat surface with the atmospheric pressure plasma.

A plasma processing method according to the present invention includes: supplying a first inert gas to a reaction space provided in a plasma head and applying a high-frequency electric field to continuously eject a primary plasma from the reaction space; forming a mixed gas area, which contains a second inert gas as a main ingredient and a proper amount of a reactive gas mixed therewith, in the plasma head or in the vicinity thereof in order to make the primary plasma collide with the mixed gas area and generate a secondary plasma; and forming the mixed gas area only at a processed portion and generating the secondary plasma when the processed portion is subjected to the plasma processing while relatively moving the plasma head and a processed object in order to carry out the processing by spraying the generated secondary plasma on the processed portion of the processed object.

A plasma processing device according to the present invention includes: a plasma head having a plasma generating section for ejecting a primary plasma composed of a first inert gas that has been made into the plasma and a plasma expanding section for generating a secondary plasma which is composed of a mixed gas made into the plasma by colliding the primary plasma into a mixed gas area of a second inert gas and a reactive gas; first inert gas supply means for supplying the first inert gas to the plasma generating section; a high-frequency power supply for applying a high-frequency electric field on the plasma generating section; mixed gas supply means for supplying the second inert gas and the reactive gas to the mixed gas area; moving means for relatively moving a processed object and the plasma head; means for recognizing timing at which the plasma head is positioned opposite to a processed portion of the processed object; and control means for controlling the high-frequency power supply, the respective gas supply means, and the moving means. The control means operates the mixed gas supply means only when the plasma head is oppositely positioned to the processed portion of the processed object.

According to the plasma processing method and device of the present invention, the processed portion is efficiently subjected to the plasma processing by spraying the secondary plasma formed as described above on the processed portion of the processed object. Stopping the formation of the mixed gas area with keeping on generating the primary plasma instantaneously stops the plasma processing by the secondary plasma in the other area except for the processed portion. Upon coming to another processed portion, the mixed gas area is formed again, and since the primary plasma is maintained, the stable secondary plasma is instantaneously generated there. Therefore, it is possible to stably and efficiently carry out the plasma processing on only the processed portion of the processed object. The processing and not-processing are switched by forming the mixed gas area and stopping it, so that the mixed gas is not consumed in not-processing time. A flow rate of the first inert gas may also be reduced, and therefore, it is possible to reduce the consumption of expensive gas. Also, it is not necessary to move the plasma head away from the processed object in not-processing time, so that it is possible to carry out the plasma processing on only the processed portion with high productivity at low cost with simple structure and control. Furthermore, since the high-frequency electric field is applied on only the reaction space where the primary plasma is generated, small electric power is enough. Since the input power is small, the temperature of the generated secondary plasma is also kept low, so that there is an effect that it becomes possible to easily carry out the plasma processing on a substrate with low heat resistance such as a substrate on which a component with low heat resistance is mounted and the like.

If the moving means is provided with a robot device and the plasma head is mounted on a movable head which is movable in X, Y, and Z directions of the robot device, it is possible to carry out the plasma processing with extremely high versatility.

A method for mounting a component on a substrate according to the present invention includes: supplying a first inert gas to a reaction space and applying a high-frequency voltage to an antenna disposed in the vicinity of the reaction space to eject a primary plasma composed of an inductively coupled plasma from the reaction space; making the primary plasma collide with a mixed gas area which contains a second inert gas as a main ingredient and a proper amount of a reactive gas mixed therewith to generate a secondary plasma; applying the generated secondary plasma to a component to-be-bonded portion of a substrate to carry out a plasma processing; and bonding a component on the component to-be-bonded portion having been subjected to the plasma processing.

A component mounting device according to the present invention includes: a plasma processing section having a plasma head and moving means, the plasma head having an inductively coupled plasma generating section for ejecting a primary plasma being an inductively coupled plasma of a first inert gas and a plasma expanding section for making the primary plasma collide with a mixed gas area which contains a second inert gas and a reactive gas to generate a secondary plasma composed of a mixed gas which has been made into the plasma, the moving means relatively moving the substrate and the plasma head in such a manner that the plasma head relatively moves along a component to-be-bonded portion of the substrate; and a component bonding section for bonding a component on the component to-be-bonded portion of the substrate.

According to the method and device for mounting the component on the substrate of the present invention, since the primary plasma composed of the inductively coupled plasma with a high plasma density is made collide with the mixed gas area of the second inert gas and the reactive gas, the second inert gas with which the primary plasma collides is made into a plasma with an avalanche multiplication and expands into the whole mixed gas area, and radicals and the like of the second inert gas that has been made into the plasma generates a secondary plasma which is composed of the reactive gas having been made into the plasma. As a result, it is possible to generate the secondary plasma which has a higher plasma density and lower plasma temperature than conventional capacitively coupled plasma. Applying the secondary plasma to the component to-be-bonded portion of the substrate efficiently carries out desired plasma processing in a short time without damaging the substrate by heat. Since the component is bonded on the component to-be-bonded portion after being subjected to the plasma processing, the component is bonded with high bonding strength and high reliability. Installing the plasma processing in a component mounting step makes it possible to mount the component on the substrate with high productivity.

Consider the case where the substrate is a panel for a flat panel display, the bonded portion is a connection electrode provided at an end of the panel, the component includes an anisotropic conductive membrane attached on the connection electrode and an electronic component for driving the flat panel display temporarily or finally press-fitted thereon, and a component mounting step has a plasma processing step, an anisotropic conductive membrane attaching step, a temporary press-fitting step, and a final press-fitting step. In this case, it is possible to manufacture the flat panel display on which the electronic component for driving are mounted through the anisotropic conductive membrane, with high productivity using a single component mounting line. When the size of the flat panel display is 10 inches or more, the foregoing effect is largely exhibited in particular.

If the reactive gas in the mixed gas in the plasma processing step includes an oxygen gas, the surface of the connection electrode of the panel is effectively reformed. The bonding strength of the anisotropic conductive membrane increases 1.3 to 2 times more than a case without the plasma processing, so that it is possible to ensure bonding strength and high reliability.

When the processing time of the plasma processing section is the shortest processing time of the anisotropic conductive membrane attaching section, the temporary press-fitting section, and the final press-fitting section or less, if the plasma processing section is added to the component mounting line, it is possible to manufacture the flat panel display in the same tact as a case without the plasma processing section.

If the same device includes the plasma processing section and the anisotropic membrane attaching section and the processing time thereof is the shortest processing time of the temporary press-fitting section and the final press-fitting section or less, when the processing time of attaching the anisotropic conductive membrane is shorter than the processing time of the temporary press-fitting and final press-fitting, it is possible to carry out the plasma processing taking advantage of surplus time. Therefore, it is possible to manufacture the flat panel display with high productivity.

If the moving means is provided with a robot device and the plasma head is mounted on a movable head which is movable in X, Y, and Z directions of the robot device, the component to-be-bonded portion is appropriately and efficiently subjected to the plasma processing by fixing the substrate in a predetermined position and moving the plasma head along the component to-be-bonded portion. Accordingly, it is possible to carry out the plasma processing on an arbitrary substrate with high versatility.

BRIEF DESCRIPTION OF THE DRAWINGS

FIG. 2A is a longitudinal sectional view, FIG. 2B is a perspective view, and FIG. 2C is a perspective view of an example in which the shape of a component is partly different;

FIG. 4A is a longitudinal sectional view of a first modification example, and FIG. 4B is a perspective view of a second modification example;

FIG. 5A is a longitudinal sectional view, and FIG. 5B is a perspective view;

FIG. 6A is a longitudinal sectional view of a first modification example, and FIG. 6B is a longitudinal sectional view of a second modification example;

FIG. 8A is a longitudinal sectional view, and FIG. 8B is a perspective view;

FIG. 9A is a perspective view, and FIG. 9B is a longitudinal sectional view;

FIG. 12A is a plan view showing an example of the processed object, and FIG. 12B is a plan view showing another example of the processed object;

FIG. 15 is an explanatory view of operation in the seventh embodiment;

FIG. 16A is the explanatory view of an operation state of the seventh embodiment, and FIG. 16B is the explanatory view of an operation state of the conventional example;

FIG. 17A is a perspective view of the entire structure, and FIG. 17B is an explanatory view of a processing process;

FIG. 19A is a plan view of an arrangement state, and FIG. 19B is a partial sectional view;

FIG. 20A is a whole perspective view, and FIG. 20B is an explanatory view of a processing process;

FIG. 26A is perspective view, and FIG. 26B is a longitudinal sectional front view.

BEST MODE FOR CARRYING OUT THE INVENTION

Embodiments of the present invention will be hereinafter described.

First Embodiment

A first embodiment of an atmospheric pressure plasma generating device according to the present invention will now be described with reference to FIGS. 1 to 4B.

Figure 1:
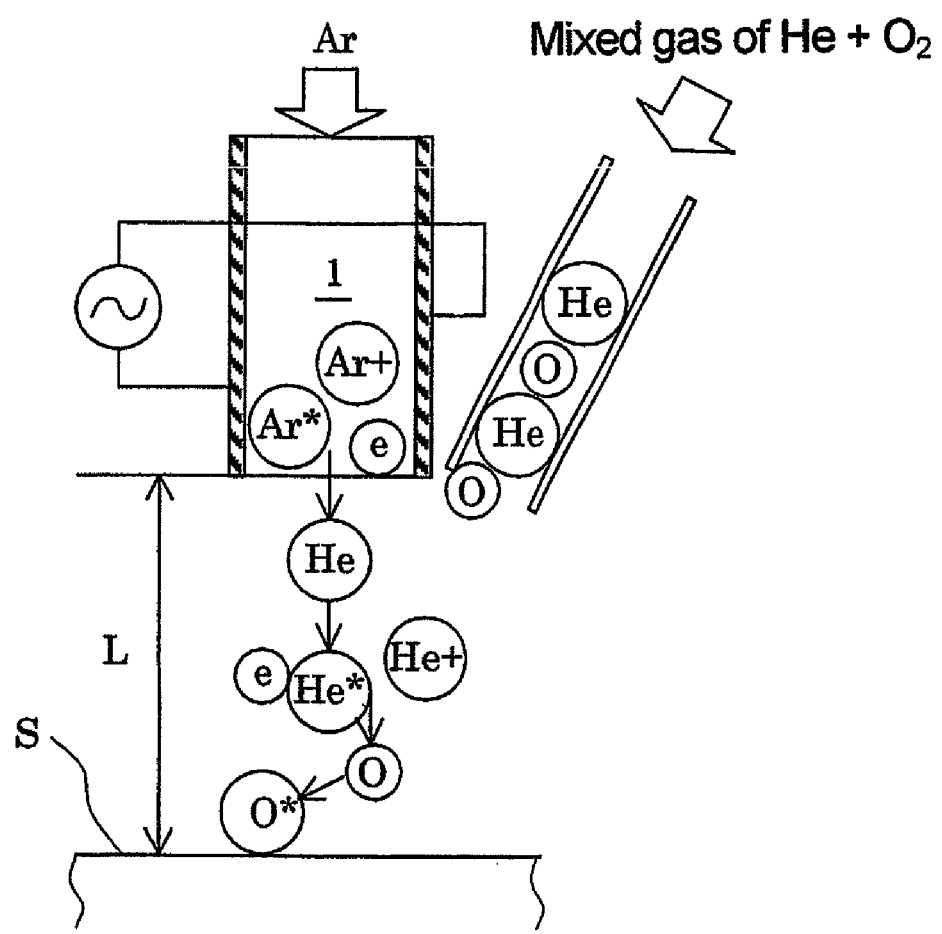
FIG. 1 is an explanatory view of the principle of plasma generation in an atmospheric pressure plasma generating device according to the present invention.

First, the principle of a method for generating an atmospheric pressure plasma according to the present invention will be described with reference to FIG. 1. FIG. 1 shows an example in which argon is used as a first inert gas, helium is used as a second inert gas, oxygen is used as a reactive gas, and a mixed gas of the second inert gas and the oxygen is supplied. Since argon is supplied and a high-frequency electric field is applied to a reaction space 1, argon atoms (Ar) in the reaction space 1 are excited or ionized by electrons (e) in a discharge plasma and become argon radicals (Ar*), argon ions (Ar$^+$), and electrons (e). The argon radicals (Ar*) in a metastable state with high energy react with the same or different kinds of atoms in the vicinity thereof for the purpose of returning to a stable state by making that atoms excited or ionized, so that a plasma reaction occurs with an avalanche multiplication. A primary plasma generated like this is ejected from the reaction space 1. Since the mixed gas of helium and oxygen is supplied to the primary plasma ejected from the reaction space 1, helium atoms (He) excited or ionized by the argon radicals (Ar*) in the primary plasma become helium radicals (He*), helium ions (He$^+$), and electrons (e). The generated helium radicals (He*) develop the foregoing reaction with an avalanche multiplication and hence helium radicals (He*) are generated. Also, oxygen atoms (O) in the vicinity thereof are excited or ionized by the helium radicals (He*) and become the oxygen radicals (O*), oxygen ions (O$^+$), and electrons (e). The oxygen radicals (O*) react with a surface material of a processed object S and carry out a plasma processing which reforms the surface or reacts with organic matters in the surface to remove them. Thus, if the distance L between the reaction space and the processed object is large, it is possible to carry out the plasma processing by the oxygen radicals (O*) in a wide range of a plane.

Figure 2A:
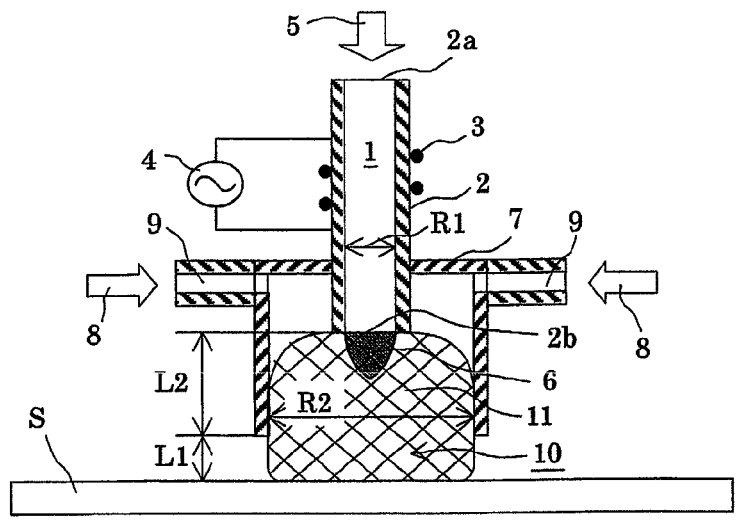
FIGS. 2A to 2C show the structure of a first embodiment of the atmospheric pressure plasma generating device according to the present invention.
Figure 2B:
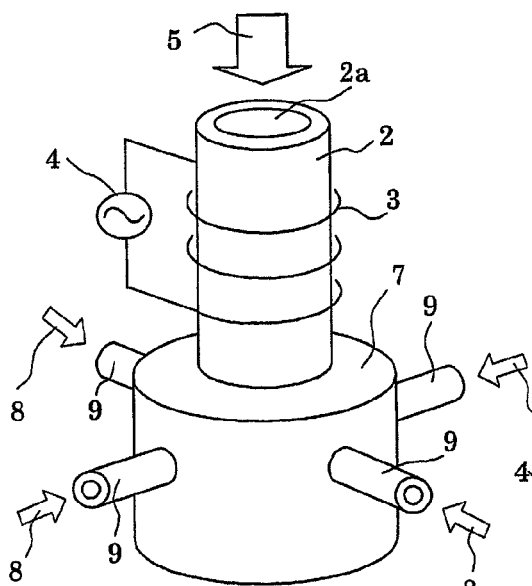
Figure 2C:
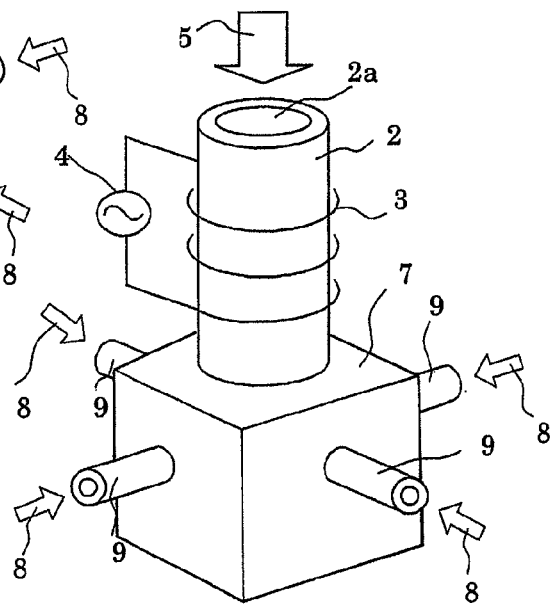

An example of the concrete structure of an atmospheric pressure plasma generating device according to this embodiment will now be described with reference to FIGS. 2A to 2C. As shown in FIGS. 2A and 2B, the atmospheric pressure plasma generating device has a cylindrical reaction vessel 2 made of a dielectric which forms the reaction space 1 being circular in cross section, serving as a plasma generating section. A coil-shaped antenna 3 is disposed on the periphery of the reaction vessel 2. A high-frequency power supply 4 applies high-frequency voltage to the antenna 3 to apply a high-frequency electric field to the reaction space 1 and a first inert gas 5 is supplied from an upper end 2a of the reaction vessel 2, so that a primary plasma 6 being an inductively coupled plasma is ejected from a lower end 2b of the reaction vessel 2. A mixed gas vessel 7 is disposed around the vicinity of the lower end 2b of the reaction vessel 2 serving as a plasma expanding section, and there is a plurality of gas inlets 9 for supplying a mixed gas 8 to the inside on the periphery of it. The mixed gas vessel 7 extends below the lower end 2b of the reaction vessel 2. A mixed gas area 10 against which the primary plasma 6 collides to generate a secondary plasma 11 is formed under the lower end 2b of the reaction vessel 2. A lower end of the mixed gas area 10 is open. The shape of the mixed gas vessel 7 is a cylinder with the open lower end in FIG. 2B, but may be a box with corners having an open lower end as shown in FIG. 2C.

In the structure described above, since the mixed gas 8 is supplied into the mixed gas vessel 7 while the primary plasma 6 is ejected from the lower end 2b of the reaction vessel 2, the primary plasma 6 collides with the mixed gas 8 in the mixed gas area 10 to generate the secondary plasma 11. The secondary plasma 11 expands to the whole area of the mixed gas area 10 and is furthermore ejected downward from the mixed gas area 10. Applying the secondary plasma 11 to a processed object S carries out a desired plasma processing. The secondary plasma 11 largely expands like this, so that it is possible to carry out the plasma processing in a large area in a planar direction in comparison with the sectional area of the reaction vessel 2 if the distance between the lower end 2b of the reaction vessel 2 and the processed object S.

Specific examples will be described. As for the structure of the device, the inside diameter R1 of the reaction vessel 2 is 0.8 mm, the inside diameter R2 of the mixed gas vessel 7 is 5 mm, the distance L1 between the lower end of the mixed gas vessel 7 and the processed object S is 1 mm, and the distance L2 between the lower end of the reaction vessel 2 and the lower end of the mixed gas vessel 7 is 4 mm. The first inert gas 5 is an argon gas with a flow rate of 50 sccm. The following gases are used as a gas supplied into the mixed gas vessel 7 and a plasma hydrophilic processing by plasma is carried out on the surface of the processed object S.

Figure 3:
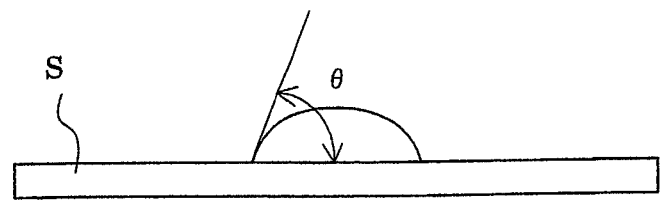
FIG. 3 is an explanatory view of a contact angle a droplet after plasma hydrophilic processing.

Practical example 1: a mixed gas of an argon gas (a flow rate of 500 sccm) serving as the second inert gas and an oxygen gas (a flow rate of 50 sccm) serving as the reactive gas, Practical example 2: a mixed gas of a helium gas (a flow rate of 500 sccm) serving as the second inert gas and an oxygen gas (a flow rate of 50 sccm) serving as the reactive gas, Comparative example 1: a single gas of only an oxygen gas (a flow rate of 500 sccm) serving as the reactive gas, Comparative example 2: a single gas of only an oxygen gas (a flow rate of 50 sccm) serving as the reactive gas. Then, water is dripped onto the surface of the processed object S, and a contact angle θ of a droplet is measured as shown in FIG. 3 to judge the quality of an affinity for water.

TABLE 1

| Item | Experimental condition of supply gas | | | Judgment result of experiment (contact angle θ: degree) |
|---|---|---|---|---|
| | Supply gas condition | Inert gas (sccm) | Oxygen gas (sccm) | |
| Comparative example 1 | Only oxygen | 0 | 500 | 107 |
| Comparative example 2 | Only oxygen | 0 | 50 | 108 |
| Practical example 1 | Mixture of argon and oxygen | 500 | 50 | 8 |
| Practical example 2 | Mixture of helium and oxygen | 500 | 50 | 8 |

Table 1 shows results. It is understood from the table 1 that the plasma processing is effectively carried out and hydrophilicity is obtained in the practical examples 1 and 2 in which the reactive gas is mixed with the second inert gas, but the effect of the plasma processing is hardly obtained in the comparative examples 1 and 2 using only the reactive gas.

Figure 4A:
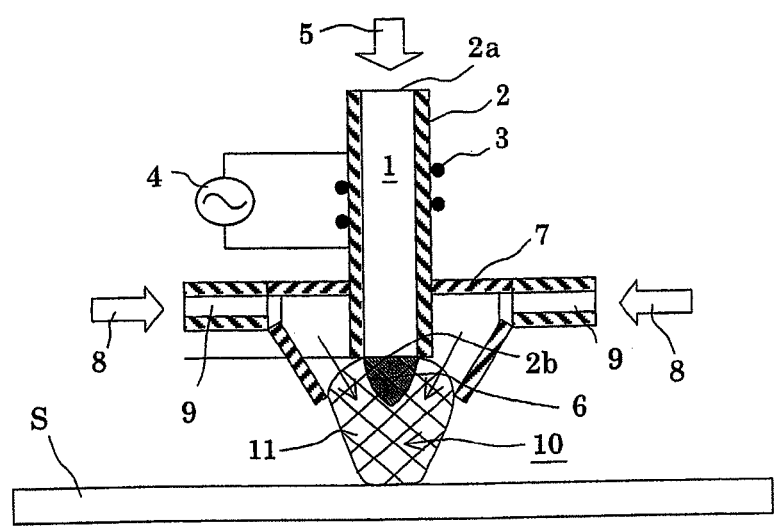
FIGS. 4A to 4B show the structure of modification examples of the foregoing first embodiment.
Figure 4B:
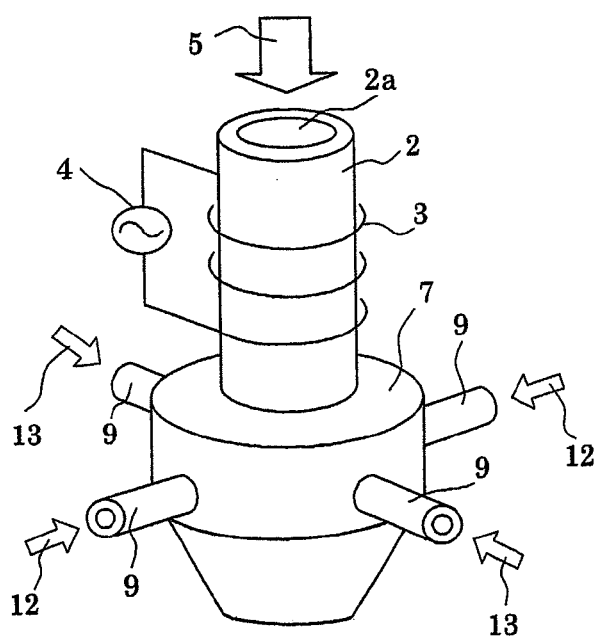

In the example of FIGS. 2A and 2B, the mixed gas vessel 7 has the shape of a cylinder. As shown in FIG. 4A, however, the mixed gas vessel 7 may be formed in the shape of an inverted cone with a contacted head the diameter of which is reduced downward so that the mixed gas 8 supplied from the gas inlets 9 more effectively collides with the primary plasma 6 ejected from the lower end 2b of the reaction vessel 2 to further efficiently generate the secondary plasma 11. In the example of FIGS. 2A and 2B, the mixed gas 8 is supplied from all the plurality of gas inlets 9 into the mixed gas vessel 7. As shown in FIG. 4B, however, a second inert gas 12 and a reactive gas 13 are separately supplied from the respective gas inlets 9 into the mixed gas vessel 7 so that the gases are mixed in the mixed gas vessel 7 to form the mixed gas area 10.

In this embodiment, the results of an experiment on an effect in the case of varying a mixing ratio of the second inert gas 12 and the reactive gas 13 will be described. The frequency of the high-frequency power supply 4 was 100 MHz and the output thereof was 40 W. Argon was used as the first inert gas 5 supplied to the reaction vessel 2 and the flow rate thereof was 50 sccm. As for the mixed gas 8 supplied to the plasma tube 21, as shown in tables 2 and 3, helium or argon with a flow rate of 500 sccm or 1000 sccm was used as the second inert gas 12, and oxygen gas was used as the reactive gas 13 with varying its flow rate between 50 sccm and 500 sccm to carry out a plasma hydrophilic processing on the surface of the processed object S. Then, the contact angle of a droplet on the surface of the processed object S was measured to judge the hydrophilicity of the surface.

TABLE 2

| Item | First inert gas Ar | Second inert gas He | Reactive gas $O_2$ | Mixing ratio of reactive gas (%) | Contact angle |
|---|---|---|---|---|---|
| Practical example 3 | 50 | 500 | 50 | 9 | 6 |
| Practical example 4 | 50 | 500 | 100 | 17 | 5 |
| Practical example 5 | 50 | 500 | 250 | 33 | 93 |
| Practical example 6 | 50 | 500 | 350 | 41 | 130 |
| Practical example 7 | 50 | 500 | 500 | 50 | 136 |

TABLE 3

| Item | First inert gas Ar | Second inert gas He | Reactive gas $O_2$ | Mixing ratio of reactive gas (%) | Contact angle |
|---|---|---|---|---|---|
| Practical example 8 | 50 | 500 | 50 | 9 | 5 |
| Practical example 9 | 50 | 500 | 100 | 17 | 6 |
| Practical example 10 | 50 | 500 | 250 | 33 | 66 |
| Practical example 11 | 50 | 500 | 350 | 41 | 119 |
| Practical example 12 | 50 | 500 | 500 | 50 | 125 |
| Practical example 13 | 50 | 1000 | 100 | 9 | 5 |
| Practical example 14 | 50 | 1000 | 200 | 17 | 5 |
| Practical example 15 | 50 | 500 | 25 | 5 | 5 |

Tables 2 and 3 show the results. As understood from the results in the tables 2 and 3, similar results are obtained irrespective of whether the second inert gas 12 is helium or argon, and the high plasma processing effect is obtained when the mixing volume ratio of the reactive gas 13 is 20% or less.

Second Embodiment

A second embodiment of the atmospheric pressure plasma generating device according to the present invention will now be described with reference to FIGS. 5A to 6B. In the description described below, the same reference numbers will refer to the same components as the foregoing embodiment and the description thereof will be omitted. Only differences will be mainly described.

Figure 5A:
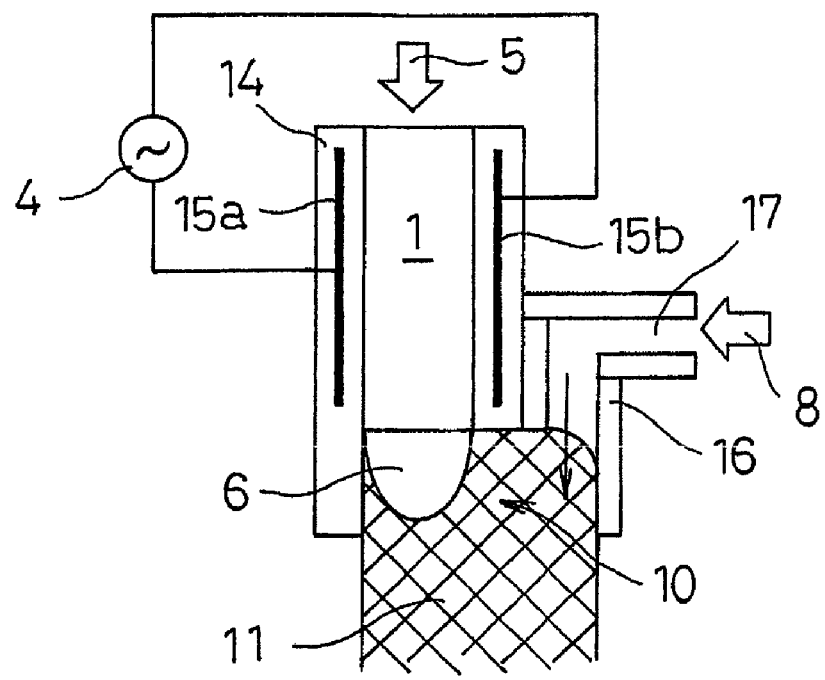
FIGS. 5A to 5B show the structure of a second embodiment of the atmospheric pressure plasma generating device according to the present invention.
Figure 5B:
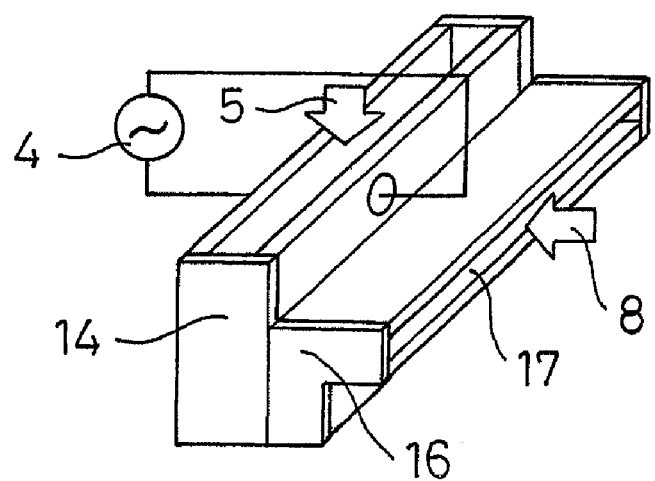

The foregoing first embodiment disclosed an example in which the cylindrical reaction vessel 2 was used, the antenna 3 disposed on the periphery thereof applied the high-frequency electric field to the reaction vessel 1, and the mixed gas vessel 7 was disposed on the periphery of the lower end 2b of the reaction vessel 2. The second embodiment, as shown in FIGS. 5A and 5B, has a rectangular tube-shaped reaction vessel 14 with a slender rectangle in cross section serving as an plasma generating section, and a pair of electrodes 15a and 15b is disposed in its long walls opposite to each other. The whole reaction vessel 14 is made of a dielectric or a dielectric is disposed in at least one of the walls opposed to the electrodes 15a and 15b. A high-frequency power supply 4 applies high-frequency voltage between the electrodes 15a and 15b to apply a high-frequency electric field to a reaction space 1 in the reaction vessel 14. Accordingly, supplying a first inert gas 5 from an upper end of the reaction vessel 14 and applying the high-frequency electric field to the reaction space 1 make a primary plasma 6 eject from a lower end of the reaction vessel 14. Also a mixed gas vessel 16 serving as a plasma expanding section is disposed adjacently to a side of the lower end of the reaction vessel 14. A mixed gas 8 of a second inert gas and a reactive gas is supplied from a gas inlet 17 disposed in an upper position of the mixed gas vessel 16. Furthermore, a mixed gas area 10 with an open lower end is formed by extending outside walls and both end walls of the reaction vessel 14 and the mixed gas vessel 16 downward so that the primary plasma 6 collides with the mixed gas flowing from the mixed gas vessel 16 into the mixed gas area 10.

Also in this embodiment, a collision of the primary plasma 6 with the mixed gas 8 in the mixed gas area 10 generates the secondary plasma 11 and the secondary plasma 11 expands to the whole area. Since the secondary plasma 11 is ejected downward from a lower end open of the mixed gas area 10, applying the secondary plasma 11 to a processed object S carries out desired plasma processing.

Figure 6A:
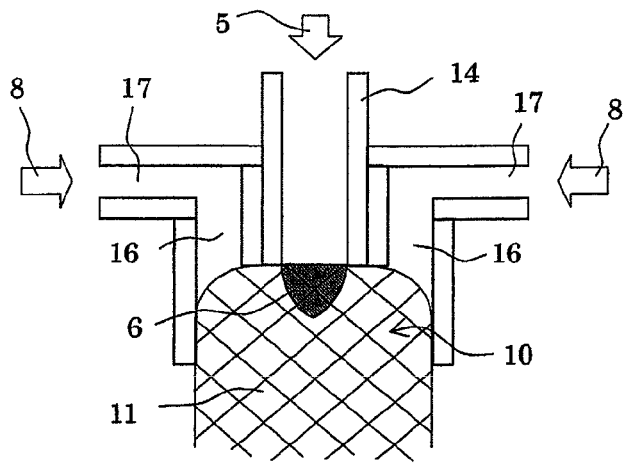
FIGS. 6A to 6B show the structure of modification examples of the foregoing second embodiment.
Figure 6B:
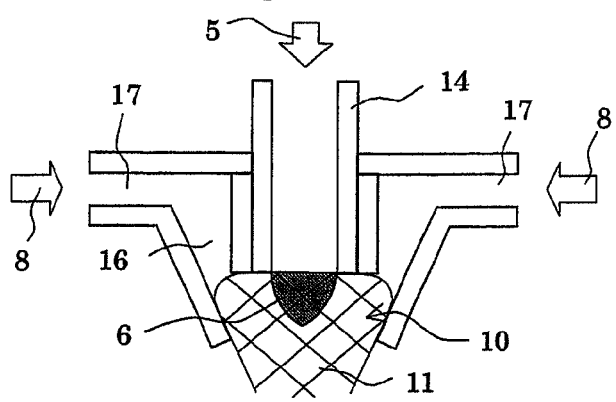

In the example shown in FIGS. 5A and 5B, the mixed gas vessel 16 is disposed on one side of the reaction vessel 14. However, as shown in FIG. 6A, the mixed gas vessel 16 may be disposed on both sides of the reaction vessel 14 so that the primary plasma 6 effectively collides with the mixed gas 8 supplied from both sides. Furthermore, as shown in FIG. 6B, outside walls of the mixed gas vessel 16 on both sides may be inwardly inclined so that the primary plasma 6 further effectively collides with the mixed gas 8 and the secondary plasma 11 is further effectively generated.

Third Embodiment

Figure 7:
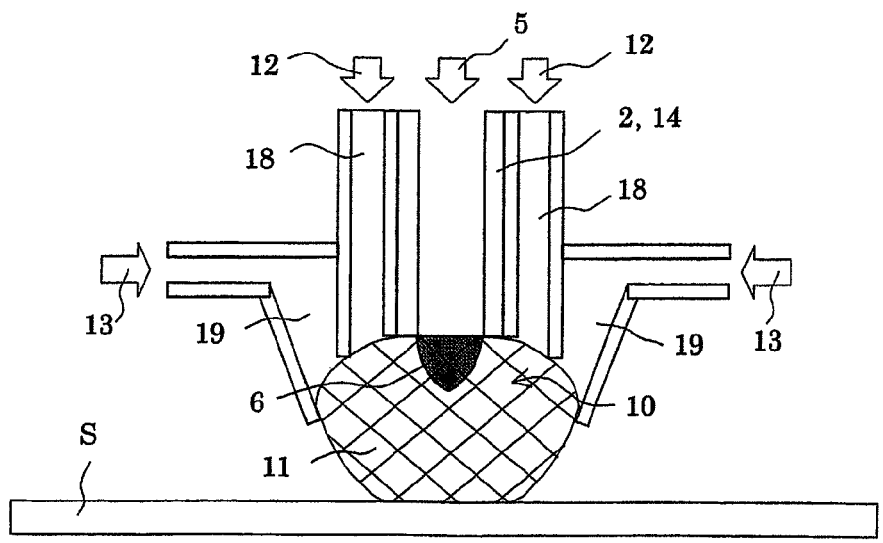
FIG. 7 is a longitudinal sectional view of a third embodiment of the atmospheric pressure plasma generating device according to the present invention.

A third embodiment of the atmospheric pressure plasma generating device according to the present invention will now be described with reference to FIG. 7.

In the foregoing first and second embodiments, the mixed gas vessel 7 and 16 for supplying the mixed gas 8 was disposed on the periphery of the lower end of the reaction vessel 2 and 14. In this embodiment, as shown in FIG. 7, an inert gas vessel 18 for supplying a second inert gas 12 is disposed on the periphery or on both sides of the reaction vessel 2 and 14.

A reactive gas vessel 19 for supplying a reactive gas 13 is disposed on the periphery or on both sides of the inert gas vessel 18, and a mixed gas area 10 is formed in the inside thereof by downwardly extending outside walls of the reactive gas vessel 19.

According to this structure, since a primary plasma 6 ejected from the reaction vessel 2 and 14 first collides with an atmosphere of only the second inert gas 12 supplied from the inert gas vessel 18, the second inert gas 12 is efficiently made into the plasma and the second inert gas 12 made into the plasma expands to the whole mixed gas area 10. Since the reactive gas 13 is mixed into the second inert gas 12 made into the plasma, the reactive gas 13 is efficiently made into the plasma and expands as secondary plasma 11, so that it becomes possible to carry out plasma processing in a wider range.

Fourth Embodiment

Figure 8A:
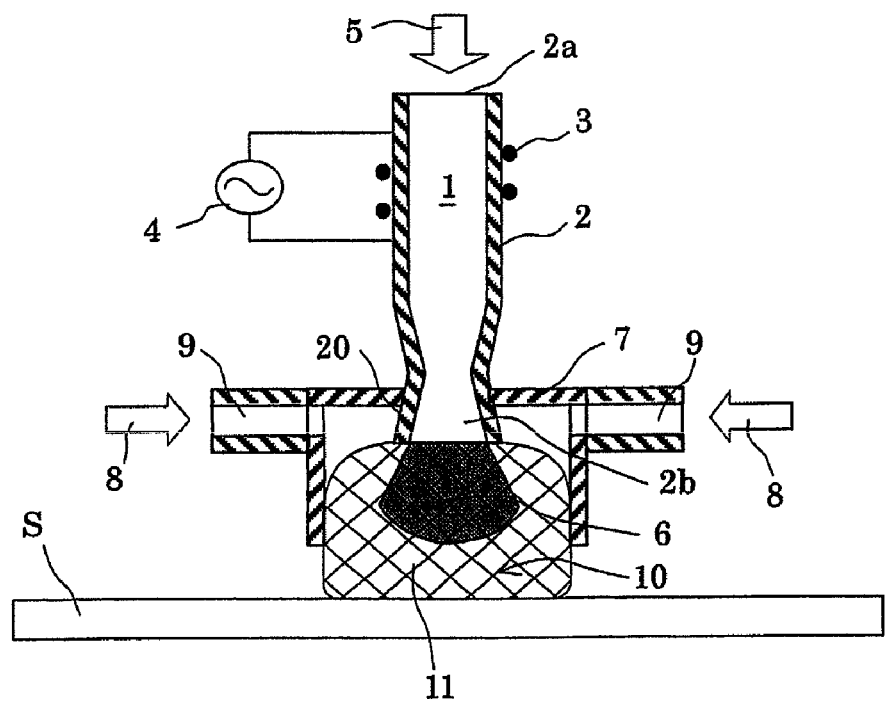
FIGS. 8A to 8B show the structure of a fourth embodiment of the atmospheric pressure plasma generating device according to the present invention.
Figure 8B:
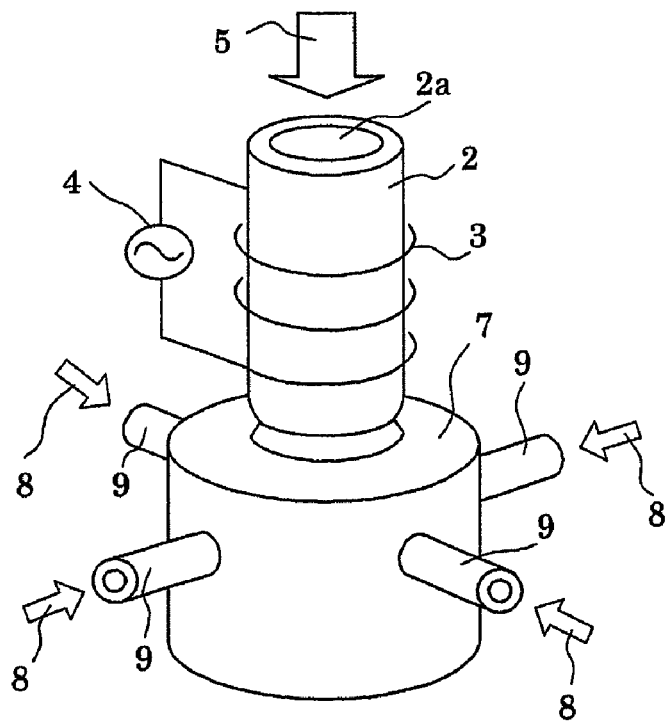

A fourth embodiment of the atmospheric pressure plasma generating device according to the present invention will now be described with reference to FIGS. 8A and 8B.

The foregoing first embodiment disclosed an example in which the reaction vessel 2 was formed into the shape of a cylinder over the whole length. However, in this embodiment, as shown in FIGS. 8A and 8B, the vicinity of the lower end 2b of the reaction vessel 2 is formed into a horn-shaped portion 20 the diameter of which downwardly extends.

According to this structure, since a primary plasma 6 is ejected from the reaction vessel 2 into a mixed gas area 10 so as to be diffused, radicals in the primary plasma 6 are efficiently mixed into a mixed gas 8 supplied to the mixed gas area 10. A second inert gas 12 and a reactive gas 13 in the mixed gas 8 are efficiently made into a plasma and expand as a secondary plasma 11, so that it becomes possible to further efficiently carry out a plasma processing in a wide range. The structure of this embodiment is applicable to the foregoing second embodiment too in a like manner.

Fifth Embodiment

Figure 9A:
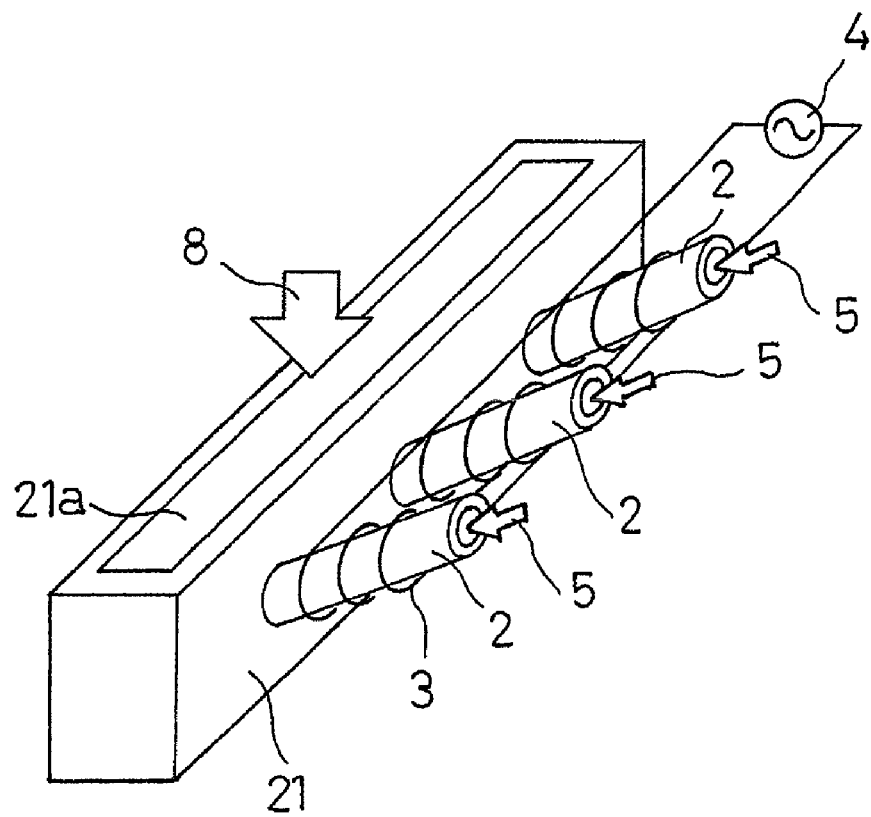
FIGS. 9A to 9B show the structure of a fifth embodiment of the atmospheric pressure plasma generating device according to the present invention.
Figure 9B:
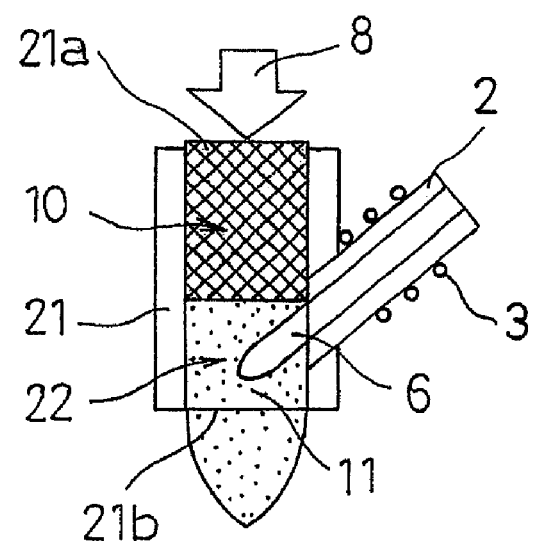

A fifth embodiment of the atmospheric pressure plasma generating device according to the present invention will now be described with reference to FIGS. 9A and 9B.

The foregoing second embodiment disclosed an example in which the reaction vessel 14 with the shape of the slender rectangle in cross section was used and the mixed gas vessel 16 was disposed on one side or both sides thereof. In this embodiment, as shown in FIG. 9A, a plasma tube 21, which has the shape of a rectangle in cross section and forms a mixed gas area 10 inside thereof, is disposed, and a mixed gas 8 of a second inert gas 12 and a reactive gas 13 is supplied from an upper end 21a thereof. A plurality of reaction vessels 2 serving as a plasma generating section is disposed at appropriate intervals on a peripheral wall of the plasma tube 21 so as to eject a primary plasma 6 into the mixed gas area 10. A first inert gas 5 is supplied to each reaction vessel 2 and a high-frequency power supply 4 applies high-frequency voltage to each coil-shaped antenna 3 disposed on the outside periphery thereof. In the plasma tube 21, a lower portion of the mixed gas area 10 below the disposed position of reaction vessel 2 from which the primary plasma 6 is ejected becomes a plasma expanding space 22, and a secondary plasma 11 is ejected from a lower end of the plasma tube 21.

According to this embodiment, the secondary plasma 11 is ejected from an area corresponding to the shape and size of the cross section of the plasma tube 21, so that it is possible to carry out a plasma processing in a wider range at a time. For example, using the plasma tube 21 with a rectangular shape in cross section as shown in FIG. 9A, relatively moving a processed object S in a direction perpendicular to a longitudinal direction of the plasma tube 21 makes it possible to evenly and efficiently carry out the plasma processing in a large area.

The atmospheric plasma generating device according to any of the foregoing first to fifth embodiments has a compact structure and hence it is possible to easily mount it on a moving head, which is movable in X, Y, and Z directions, of a robot device. Accordingly, it is possible to precisely and efficiently carry out the plasma processing on arbitrary portions and areas of various processed objects, in particular, on minute areas. Thus, it is possible to provide a compact plasma processing device with extremely high versatility.

Sixth Embodiment

A sixth embodiment of the atmospheric pressure plasma generating device according to the present invention will now be described with reference to FIG. 10.

Figure 10:
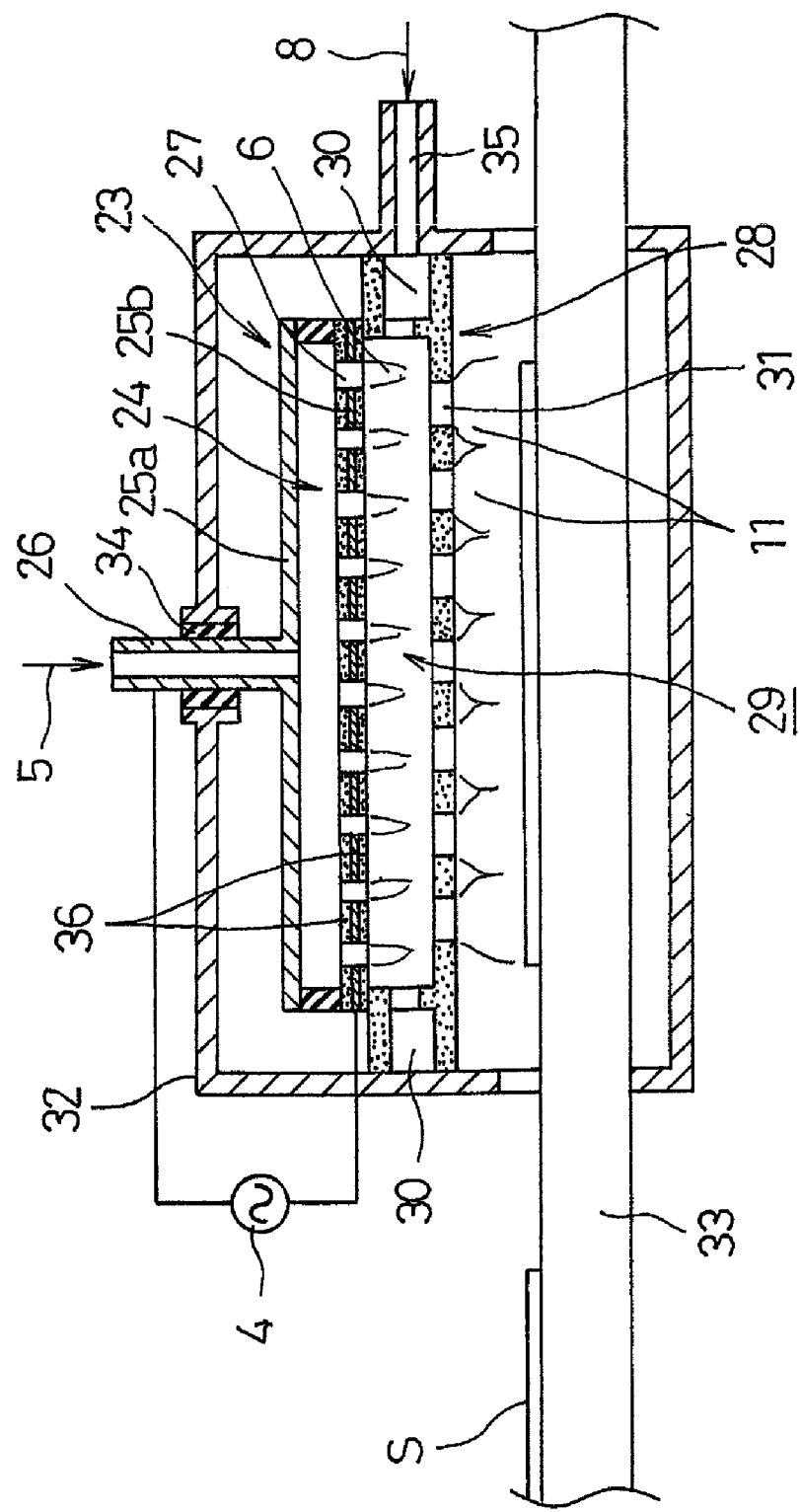
FIG. 10 is a longitudinal sectional view of a sixth embodiment of the atmospheric pressure plasma generating device according to the present invention.

In this embodiment, as shown in FIG. 10, provided is a plasma generating section 23 in the shape of a hollow flat plate which includes a perpendicularly-opposed pair of electrodes 25a and 25b disposed so as to sandwich a flat reaction space 24. A first inert gas 5 is supplied from a gas supply pipe 26 disposed on the upper electrode 25a into the reaction space 24 and a high-frequency power supply 4 applies a high-frequency voltage between the electrodes 25a and 25b in order to eject a primary plasma 6 from a plurality of openings 27 which is disposed in the lower electrode 25b and provided in a bottom face of the reaction space 24. There is a plasma expanding section 28 adjacent to a lower section of the plasma generating section 23 in such a manner that the primary plasma 6 is ejected into an inside mixed gas area 29. A mixed gas 8 of a second inert gas 12 and a reactive gas 13 is supplied from a gas supply header 30 provided on the periphery of the mixed gas area 29 into the mixed gas area 29. When the primary plasma 6 ejected from the openings 27 collides with the mixed gas 8, a secondary plasma 11 is generated. Then, the secondary plasma 11 is ejected from a plurality of openings 31 provided in a bottom face of the plasma expanding section 28 opposed to the plasma generating section 23.

The lower electrode 25b of the plasma generating section 23 is made of a porous metal plate having openings corresponding to the openings 27. Also, a dielectric 36 such as ceramic is integrally disposed at least on an upper face of the electrode 25b and suitably on both faces exposed to a plasma, and the openings 27 are formed through it. The atmospheric pressure plasma generating device with the foregoing structure is disposed in an upper portion of a processing chamber 32, and moving means 33, which carries a processed object S into a position oppositely below the plasma expanding section 28 to fix it in that position and carries it out after the plasma processing, is disposed in a lower portion of the processing chamber 32. The gas supply pipe 26 extends to the outside via an insulating member 34 through a ceiling wall of the processing chamber 32. An outside peripheral wall of the gas supply header 30 is a peripheral wall of the processing chamber 32, and a gas inlet 35 for supplying the mixed gas 8 into the gas supply header 30 is provided in the peripheral wall of the processing chamber 32.

According to this embodiment, the primary plasma 6 is ejected from a plurality of openings 27 in the bottom face of the plasma generating section 23 into the mixed gas area 29 in the plasma expanding section 28. The mixed gas 8 having been made into a plasma generates a secondary plasma 11, and the secondary plasma 11 is evenly ejected from a plurality of openings 31 in the bottom face of the plasma expanding section 28 over approximately the whole surface. Thus, the whole surface of the processed object S, which is carried in and fixed in its position by the moving means 33, is evenly subjected to the plasma processing at a time. Therefore, it is possible to evenly carry out the plasma processing on a flat surface with a large area at a time by the atmospheric pressure plasma.

Seventh Embodiment

A seventh embodiment of a plasma processing apparatus according to the present invention will now be described with reference to FIGS. 11 to 16B.

Figure 11:
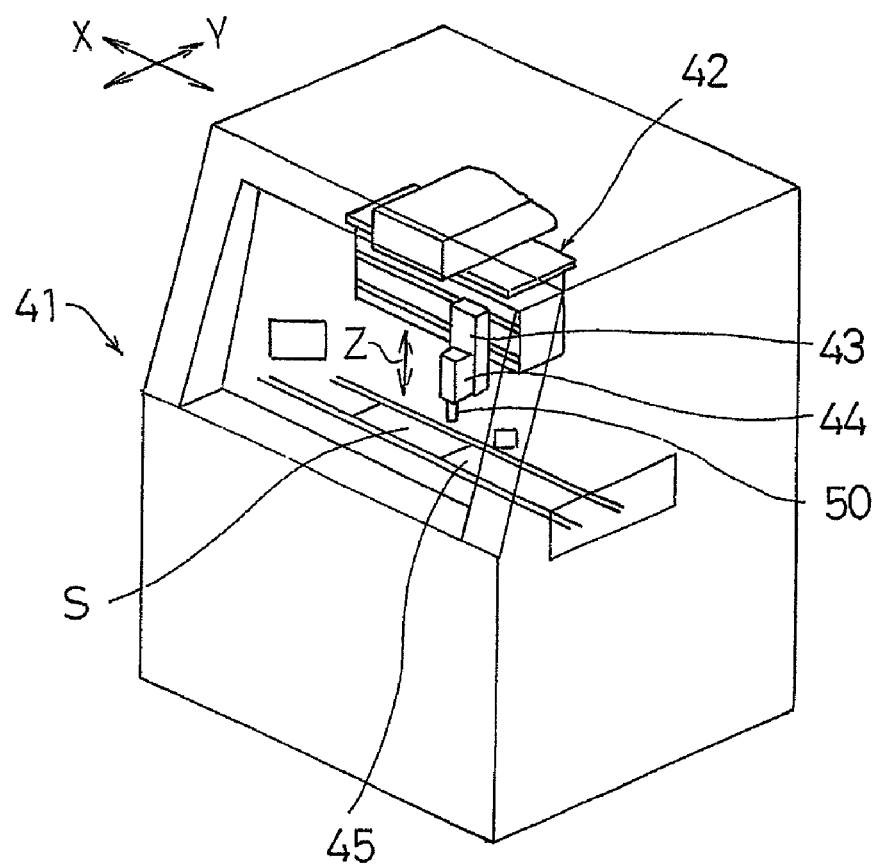
FIG. 11 is a perspective view showing the entire structure of a seventh embodiment of the atmospheric pressure plasma generating device according to the present invention.

With reference to FIG. 11, the plasma processing apparatus 41 according to the present invention is provided with a robot device 42 serving as moving means for moving and fixing its position in three axial directions. The robot device 42 is configured to include a moving member 43 which can move and fix its position in orthogonal two axial directions (X-Y axial directions) in a horizontal plane, a movable head 44 attached to the moving member 43 so as to be movable and fixed its position in a perpendicular direction (Z axial direction), and a plasma head 50 provided on the movable head 44. A carrying in and out section 45, on the other hand, carries a processed object S into and out of a lower position of a movable range of a plasma head 10 to arrange and fix it in a predetermined position.

Figure 12A:
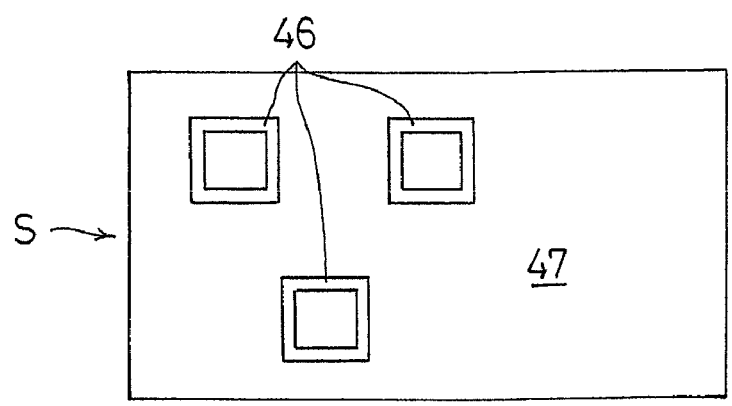
FIGS. 12A to 12B show examples of a processed object.
Figure 12B:
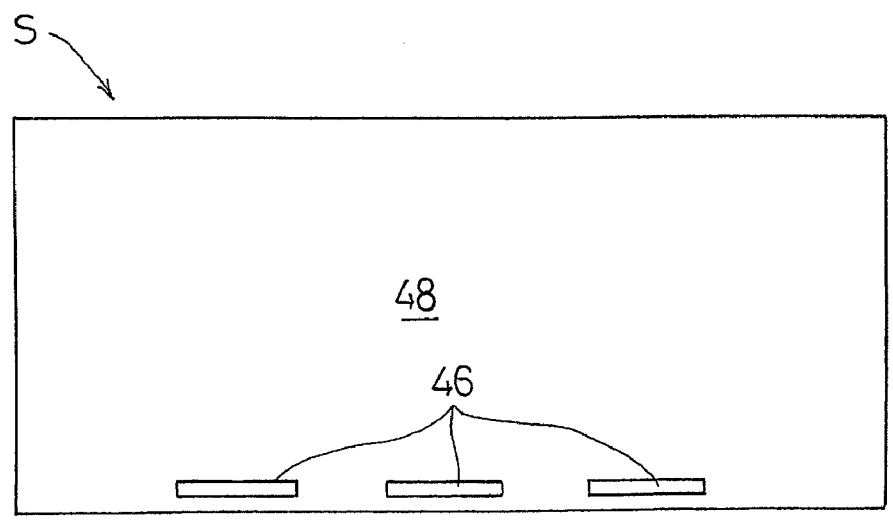

In the processed object S, as shown in FIGS. 12A and 12B, there is a separate plurality of processed portions 46 to be subjected to plasma processing. As the processed object S like this, there are an example of a circuit substrate 47 in which land areas for mounting electronic components correspond to the processed portions 46 as shown in FIG. 12A and an example of a flat panel display 48 such as a liquid crystal panel and a plasma display panel in which anisotropic conductive membrane attached areas correspond to the processed portions 46 as shown in FIG. 12B, and the surfaces of lands are reformed and the attached areas are cleaned, respectively, by the plasma processing.

Figure 13:
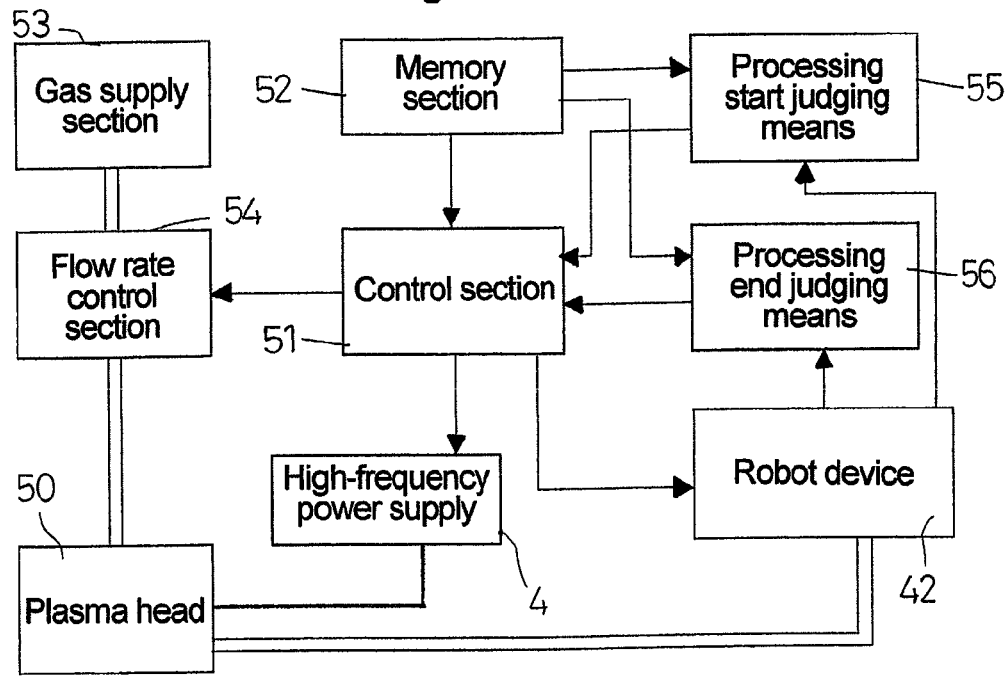
FIG. 13 is a block diagram of control structure according to the seventh embodiment.

The devices of the foregoing first to fifth embodiments are applicable as the plasma head 50, but the device according to the first embodiment shown in FIGS. 2A to 2C is applied to this embodiment. With reference to FIG. 13, as the control structure of the plasma processing apparatus 41, a control section 51 controls the robot device 42 serving as the moving means of the plasma head 50, a high-frequency power supply 4, and a flow rate control section 54 for controlling the supply of gas from a gas supply section 53 to the plasma head 50 on the basis of operation programs and control data stored in a memory section 52 in advance. When the control section 51 controls the flow rate control section 54, based on the timing of oppositely positioning the plasma head 50 on the processed portion 46 of the processed object S, in other words, signals inputted from a processing start judging means 55 and processing end judging means 56 for judging the start and end of processing on the processed portion 46, a mixed gas 8 is supplied into a mixed gas vessel 7 by a processing start signal to carry out the plasma processing on the processed portion 46 and the supply of the mixed gas 8 is stopped by a processing end signal to end the plasma processing on the processed portion 46. In this embodiment, the processing start judging means 55 and the processing end judging means 56 judge a start and an end by comparing the control data stored in the memory section 52 with current position data from the robot device 42, but there may be separately provided means for judging a start and an end when the plasma head 50 is oppositely positioned in a start point and an end point of the processed portion 46. The control section 51 and the robot device 42 may be integrally provided instead of being separated.

Figure 14:
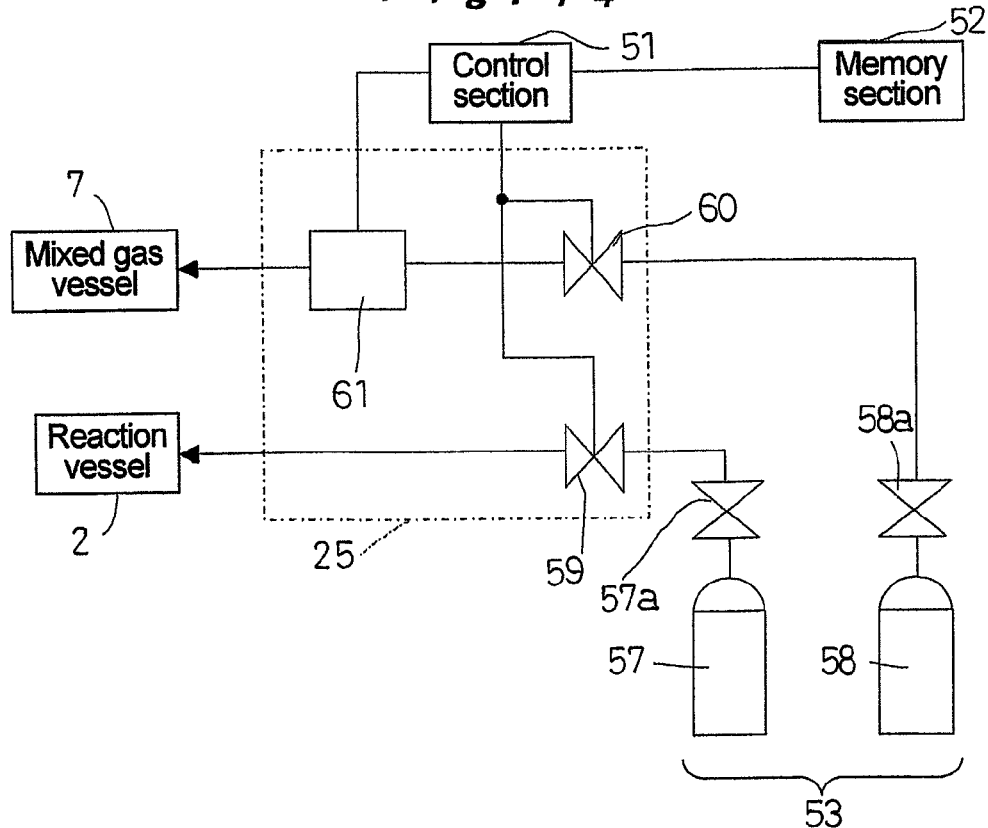
FIG. 14 is a diagram showing the structure of a gas supply section and a flow rate control section according to the seventh embodiment.

The gas supply section 53 and the flow rate control section 54 concretely have respective structures as shown in FIG. 14. Namely, the gas supply section 53 has a first inert gas supply source 57 for supplying a first inert gas 5 and a mixed gas supply source 58 for supplying the mixed gas 8 of a second inert gas and a reactive gas, and pressure-regulating valves 57a and 58a are provided in gas outlets, respectively. The first inert gas 5 is supplied to a reaction vessel 2 through a first flow rate control device 59 which is composed of a mass flow controller and the like. The mixed gas 8 is supplied to a mixed gas vessel 7 through a second flow rate control device 60 which is composed of a mass flow controller and the like and an open/close control valve 61. The open/close control valve 61 and the first and second flow rate control devices 59 and 60 compose the flow rate control section 54, and control section 51 controls each component.

In the foregoing structure, the secondary plasma 11 generated by the collision of primary plasma 6 is ejected downward in the plasma head 50, and applying the secondary plasma 11 to the processed portion 46 of the processed object S carries out a desired plasma processing. Then, since the secondary plasma 11 largely develops as described above, even if the distance between a lower end 2b of the reaction vessel 2 and the processed object S is large, it is possible to efficiently and certainly carry out the plasma processing on a large area as compared with the cross-sectional area of the reaction vessel 2 also in a planar direction in a short time.

The process of the plasma processing on the processed portion 46 of the processed object S by the plasma processing device 41 with the foregoing structure will now be described.

When the carrying in and out section 45 carries in and fixes the processed object S in a predetermined position, the robot device 42 starts operation to move the plasma head 50 to the processing start point of the first processed portion 46 of the processed object S. Then, the first inert gas 5 is supplied to the reaction vessel 2 serving as the plasma generating section and a high-frequency power supply 4 applies a high-frequency electric field. Since a plasma igniter (not illustrated) momentarily generates high voltage, the primary plasma 6 is generated. The primary plasma 6 is ejected into the mixed gas vessel 7 and this state is successively maintained after this.

When the plasma head 50 approaches the processing start point in this state, as shown in FIG. 15, a detection signal of the processing start judging means 55 rises at a point of to. The open/close control valve 61 is immediately opened and the mixed gas 8 is supplied to the mixed gas vessel 7 at the immediately following point of $t_1$. The secondary plasma 11 is generated and the plasma processing is started on the processed portion 46 as described above, and then moving the plasma head 50 above the processed portion 46 with maintaining a plasma processing state carries out the plasma processing on the processed portion 46. Then, a detection signal of the processing end judging means 56 falls at a point of $t_2$, and the open/close control valve 61 is immediately closed. The supply of the mixed gas 8 to the mixed gas vessel 7 is stopped at the immediately following point of $t_3$ to stop the generation of the secondary plasma 11, so that the plasma processing is immediately stopped. Accordingly, the plasma processing on the first processed portion 46 is ended.

Then, the operation of the robot device 42 continues, and the plasma head 50 moves to a processing start point of the next processed portion 46 of the processed object S. During this time, a state of the primary plasma 6 ejected into the mixed gas vessel 7 is maintained but the secondary plasma 11 is not generated so that the plasma processing is not carried out at all. Then, upon reaching the processing start point at a point of $t_4$, the detection signal of the processing start judging means 55 rises. The open/close control valve 61 is immediately opened, and the mixed gas 8 is supplied to the mixed gas vessel 7 at the immediately following point of $t_5$ to generate the secondary plasma 11 and start the plasma processing on the next processed portion 46 as described above. After that, the foregoing operation is repeated until finishing the plasma processing of all the processed portions 46 of the processed object S. When the plasma processing of all the processed portions 46 is finished, the carrying in and out section 45 carries out the processed object S and carries in the next processed object S to carry out the plasma processing in a like manner.

Figure 16A:
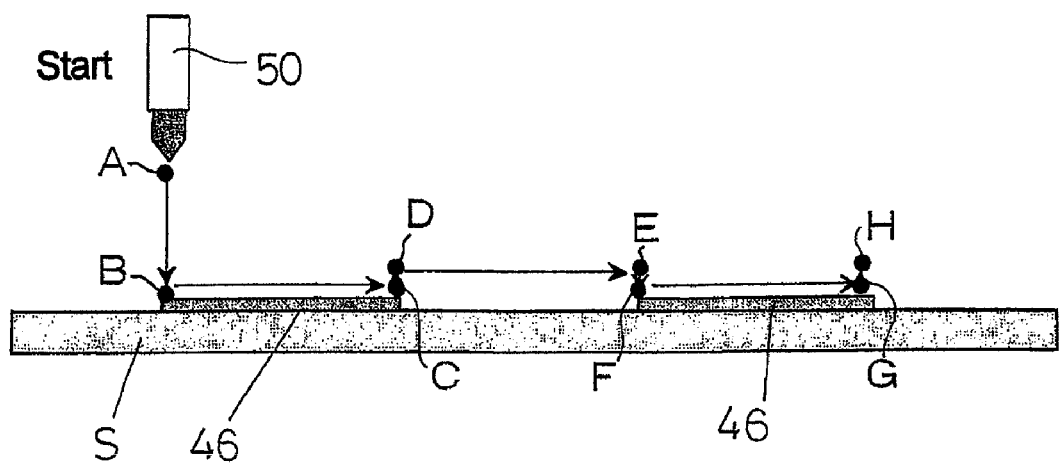
FIGS. 16A to 16B are explanatory views of the operation of the embodiment of the present invention and a conventional example.

As described above, the supply and stop of the mixed gas 8 to the mixed gas vessel 7 switches forming and stopping the secondary plasma 11. Thus, according to this embodiment, as shown in FIG. 16A, after the plasma head 50 is moved down from a point A to a processing start point B of the first processed portion 46, moving the plasma head 50 to a processing end point C (=D) carries out the plasma processing of the first processed portion 46. The plasma head 50 is continuously moved to a processing start point E (=F) of the next processed portion 46 with maintaining its height, and the plasma processing is carried out during moving from that point to a processing end point G (=H). Then, the plasma head 50 is moved from the same point H to the next processed portion 46. Repeating the foregoing operation stably carries out the plasma processing on only a plurality of processed portions 46 with maintaining the vertical position of the plasma head 50. The moving path of the plasma head 50 is straight and its moving control is easy, so that it is possible to carry out the plasma processing with high productivity.

Figure 16B:
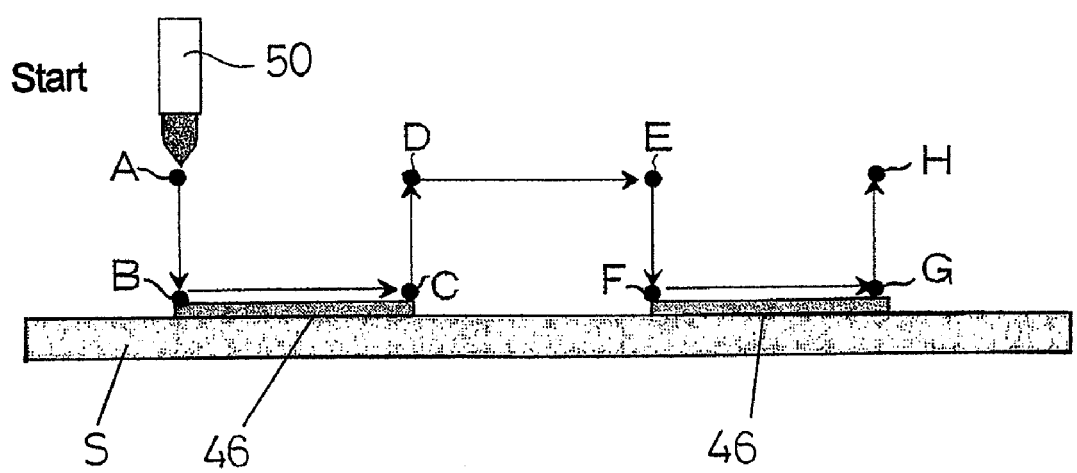

Conversely, as shown in FIG. 16B, the plasma head 50 is conventionally moved down from a point A to a vertical position in which a processing start point B of the first processed portion 46 is subject to the plasma processing, and then moving the plasma head 50 to a processing end point C carries out the plasma processing on the first processed portion 46. Then, the plasma head 50 is raised to a vertical position D in which the processed object S is not subjected to the plasma processing and is moved to a position E which is above a processing start point F of the next processed portion 46 with maintaining its height. Next, the plasma head 50 is moved down from the point E to the point F in which the plasma processing can be carried out, and the plasma processing is carried out with moving to a processing end point G. Then, the plasma head 50 is raised to a position H to move it to the next processed portion 46. Repeating such operation makes the moving path and moving control of the plasma head 50 complicated, and hence there is the problem that the productivity of the plasma processing becomes bad.

In the foregoing embodiment, the robot device 42 with the plasma head 50 is used as moving means for relatively moving the plasma head 50 to the processed object S, but the moving means is not limited to it. For example, carrying means for carrying the processed object S may be used as the moving means and the plasma head 50 may be fixed. Otherwise, means for moving each of the processed object S and the plasma head 50 may be provided.

Eighth Embodiment

An eighth embodiment in which a component mounting apparatus according to the present invention is applied to a component mounting apparatus for mounting a driving component on a liquid crystal display being an example of a flat panel display will now be described with reference to FIGS. 17A to 19B.

Figure 17A:
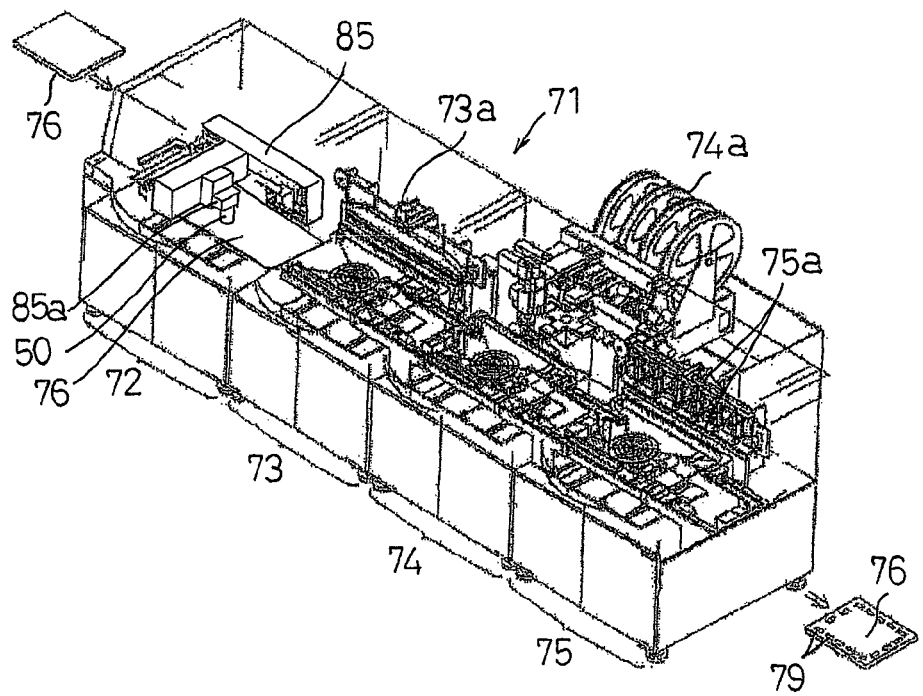
FIGS. 17A to 17B show a component mounting apparatus according to an eighth embodiment of the present invention.
Figure 17B:
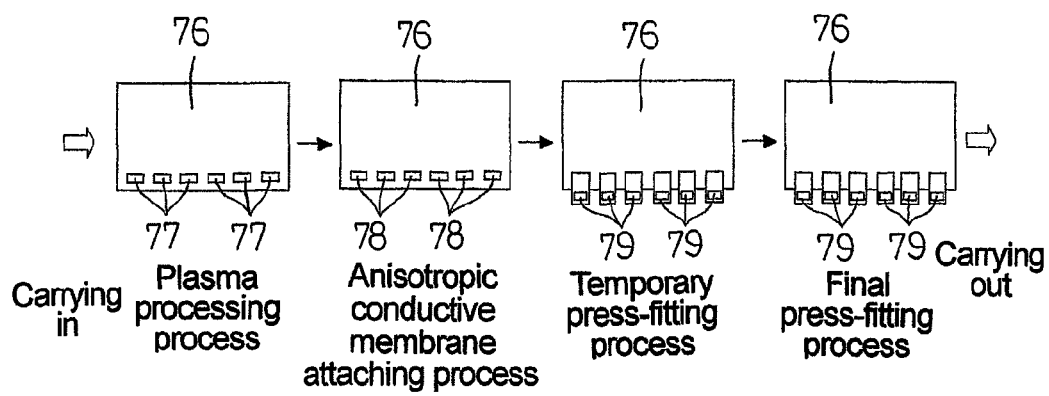

In FIGS. 17A and 17B, 71 denotes a component mounting apparatus for a liquid crystal panel including a plasma processing section 72, an anisotropic conductive membrane attaching section 73, a temporary press-fitting section 74, and a final press-fitting section 75. A liquid crystal panel 76 carried in by carrying means (not illustrated) is accepted by the plasma processing section 72 to carry out surface reforming on component to-be-bonded portions 77 by plasma processing. Next, the liquid crystal panel 76 is carried to the anisotropic conductive membrane attaching section 73, and the component to-be-bonded portions 77 of the liquid crystal panel 76 are fixed in positions immediately below anisotropic conductive membrane attaching means 73a to attach anisotropic conductive membranes on the component to-be-bonded portions 77. Next, the liquid crystal panel 76 is carried to the temporary press-fitting section 74 and electronic components 79 provided by a component provider 74a such as an IC and a TAB board for driving the liquid crystal panel 76 are temporarily press-fitted on the anisotropic conductive membranes 78. Next, the liquid crystal panel 76 is carried to the final press-fitting section 75 and a press-fitting tool 75a finally fits each of temporarily press-fitted portions with higher temperature and pressure to mount the electronic components 79. The liquid crystal panel 76 on which the electronic components 79 are mounted like this is carried out of the component mounting apparatus 71.

Figure 18A:
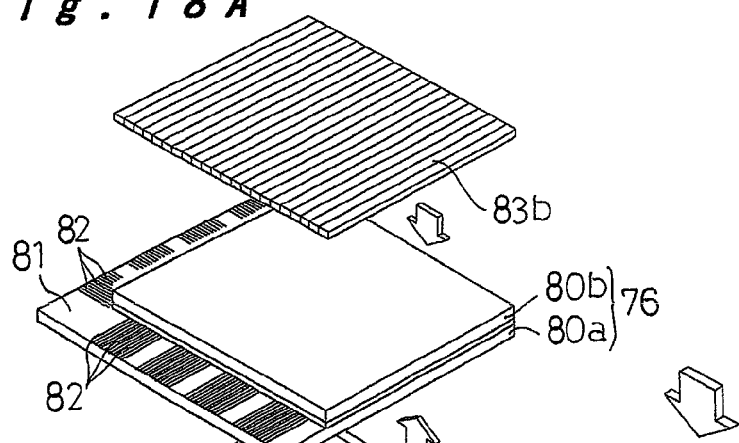
FIGS. 18A to 18D are perspective views for showing manufacturing processes of a liquid crystal panel.
Figure 18B:
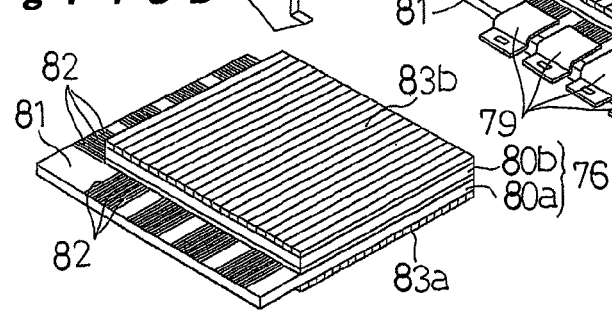
Figure 18C:
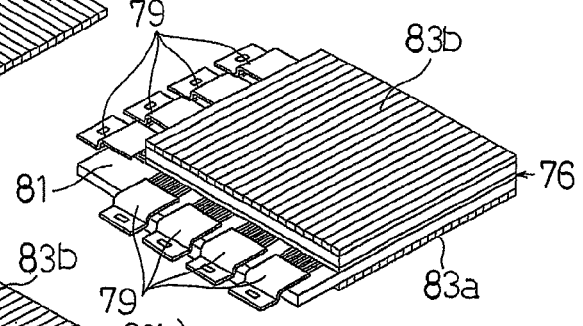
Figure 18D:
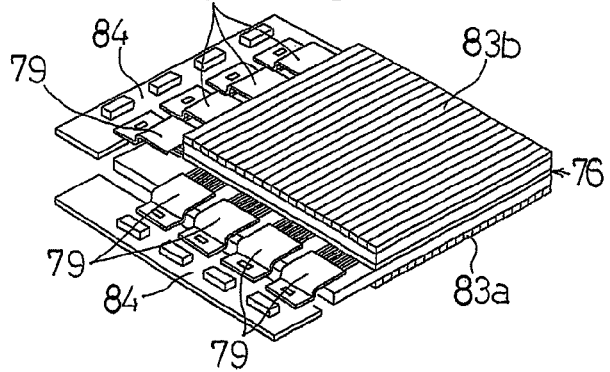

The assembly process of the liquid crystal panel 76 will be described with reference to FIGS. 18A to 18D. The liquid crystal panel 76 is composed of a liquid crystal sandwiched between two glass substrates 80a and 80b. A side end portion of one glass substrate 80a is protruded to provide a protrusion portion 81 and connection electrodes 82 connected to electrodes for driving the liquid crystal are provided in the inside surface of the protrusion portion 81. The protrusion portion 81 is provided at only one side end portion as an example shown in FIG. 17B when the liquid crystal panel 76 is small, is provided at two side end portions adjoining in the shape of the letter L as shown in FIG. 18B when the liquid crystal panel 76 has a middle size, and is provided at three side end portions adjoining in the shape of the letter U when the liquid crystal panel 76 is large. With reference to FIG. 18A, polarizing plates 83a and 83b are attached on both surfaces of the liquid crystal panel 76 except for the protrusion section 81 in advance, and the liquid crystal panel 76 is carried into the component mounting apparatus 71 in a state shown in FIG. 18B. In the component mounting apparatus 71, the electronic components 79 are mounted so as to be bonded to the connection electrodes 82 provided on the protrusion section 81 through the anisotropic conductive membranes as described above. The liquid crystal panel 76 in a state shown in FIG. 18C is carried out, and then, as shown in FIG. 18D, each of the electronic components 79 is bonded to printed wiring boards 84 and the liquid crystal panel 76 is installed in a liquid crystal display device (not illustrated).

Figure 19A:
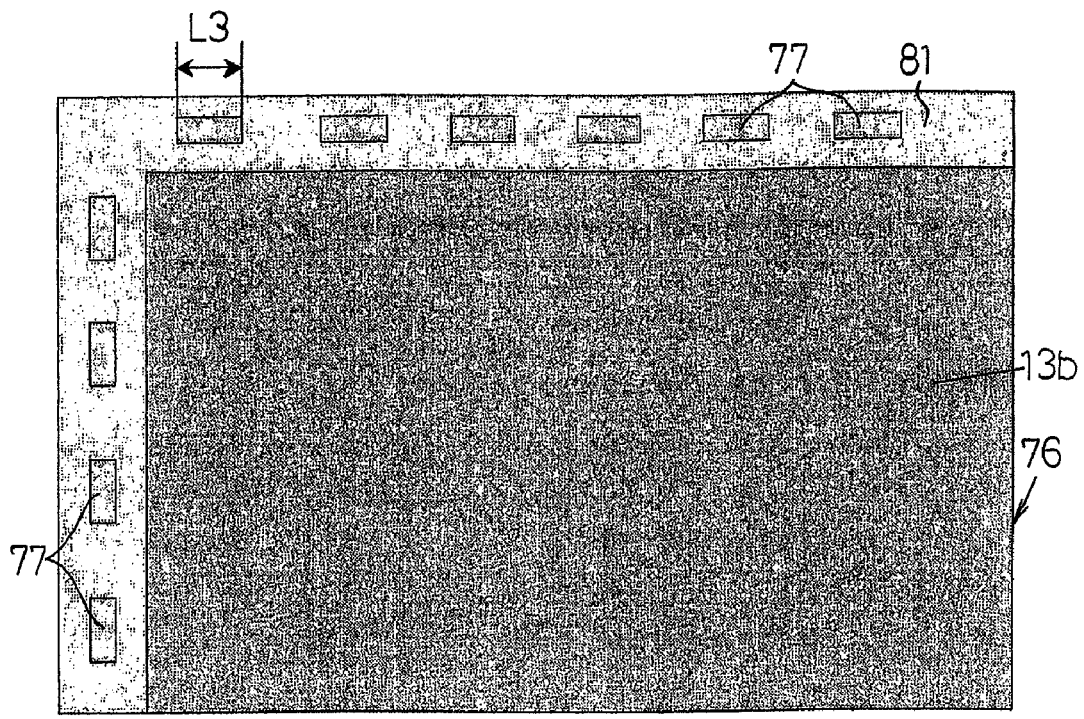
FIGS. 19A to 19B show a plasma processed portion of the liquid crystal panel.
Figure 19B:
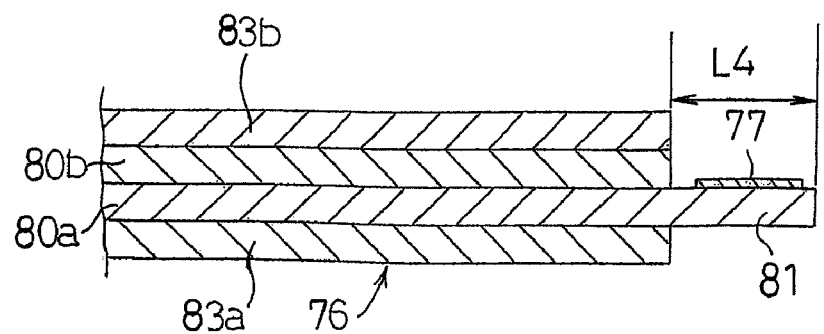

In the liquid crystal panel 76 like this, a plurality of component to-be-bonded portions 77 with a predetermined length of L3 to which the electronic components 79 are bonded is provided in the protrusion section 81 of one glass substrate 80a at established intervals as shown in FIG. 19A, and it is preferable that only the component to-be-bonded portions 77 be subjected to the plasma processing in a plasma processing process. As shown in FIG. 19B, there is a case where the width size L4 of the protrusion section 81 is several to 40 mm in the middle or large-sized liquid crystal panel 76 especially when a liquid crystal drive IC is mounted thereon. In that case, an area to be subjected to the plasma processing becomes large. Thus, it takes much processing time when the plasma processing section 72 carries out the plasma processing by applying ordinary capacitively coupled plasma, so that it is impossible to fit the plasma processing to the tact of the following anisotropic conductive membrane attaching section 73, the temporary press-fitting section 74, and the final press-fitting section 75. Therefore, it was impossible to realize the component mounting apparatus 71 having a line of the plasma processing section 72, the anisotropic conductive membrane attaching section 73, the temporary press-fitting section 74, and the final press-fitting section 75.

The plasma processing section 72 according to this embodiment, as shown in FIG. 17A, is provided with the robot device 85 serving as moving means which is movable and fixable in the three axial directions, and the plasma head 50 is mounted on the movable head 85a which is movable and fixable in the X-Y-Z three axial directions. The liquid crystal panel 76 is carried in and out under a movable range of the plasma head 50 by a carrying in and out section (not illustrated) and is arranged and fixed in a predetermined position.

The plasma head 50 has a structure shown in FIGS. 2A and 2C of the first embodiment. The plasma processing section 72 has a control structure of FIG. 13, and the structure of a gas supply section and a flow rate control section therein is the same as that of FIG. 14 in the seventh embodiment. Furthermore, the plasma processing process of the component to-be-bonded portion 77 of the liquid crystal panel 76 by the plasma processing section 72 is the basically same as that of the foregoing seventh embodiment described with reference to FIG. 15 and hence the description thereof will be omitted. According to the processing process, the moving path of the plasma head 50 is straight as described above and its moving control is easy, so that it is possible to carry out the plasma processing with high productivity.

As an example of a processing tact, in the case of the liquid crystal panel 76 of 10 to 20 inches, the anisotropic conductive membrane attaching section 73 takes 5 to 7 seconds, the temporary press-fitting section 74 takes 8 to 15 seconds, and the final press-fitting section 75 takes 8 to 15 seconds. It is preferable that the processing tact of the plasma processing section 72 be set shorter than that of the anisotropic conductive membrane attaching section 73, and this embodiment can realize it.

In the foregoing embodiment, the robot device 85 with the plasma head 50 is used as the moving means for relatively moving the plasma head 50 to the liquid crystal panel 76, but the moving means is not limited to this. For example, carrying means for carrying the liquid crystal panel 76 may be used as the moving means and the plasma head 50 may be fixedly disposed. Otherwise, there may be provided means for moving each of the liquid crystal panel 76 and the plasma head 50.

Ninth Embodiment

A ninth embodiment of the component mounting apparatus according to the present invention will now be described with reference to FIGS. 20A and 20B.

Figure 20A:
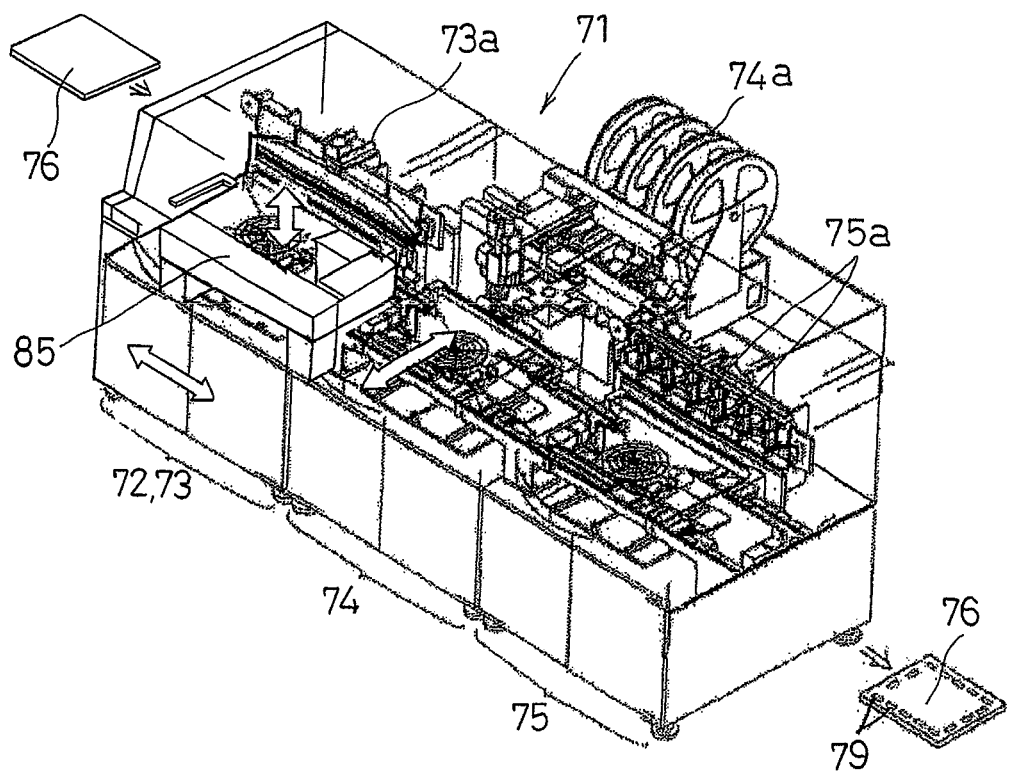
FIGS. 20A to 20B show a component mounting apparatus according to a ninth embodiment of the present invention.
Figure 20B:
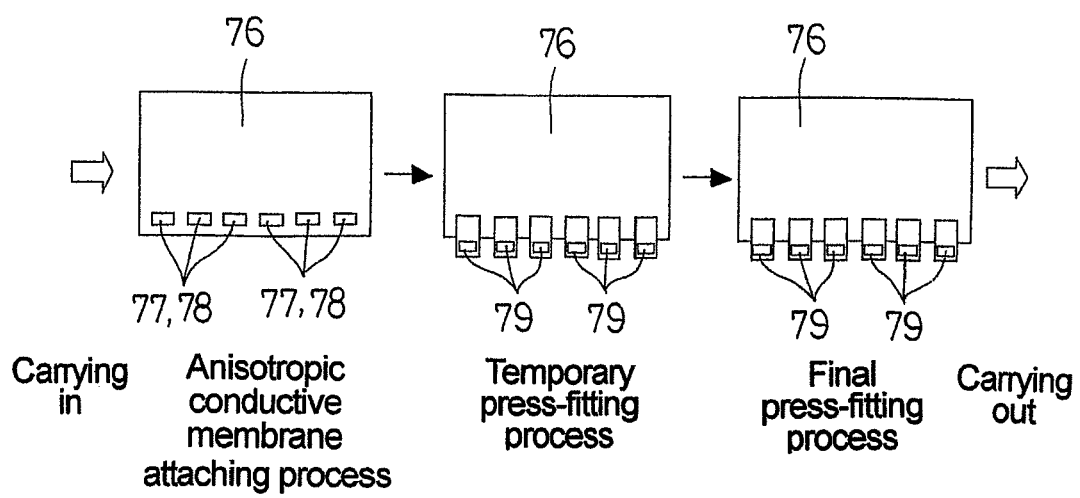
Figure 21:
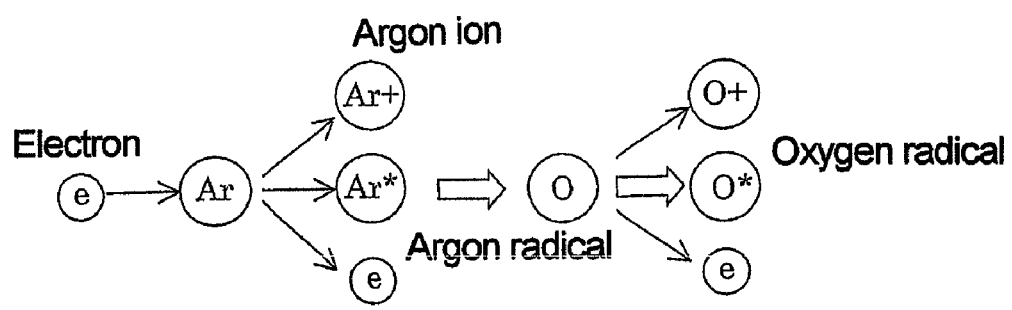
FIG. 21 is an explanatory view of the principle of plasma generation.
Figure 22:
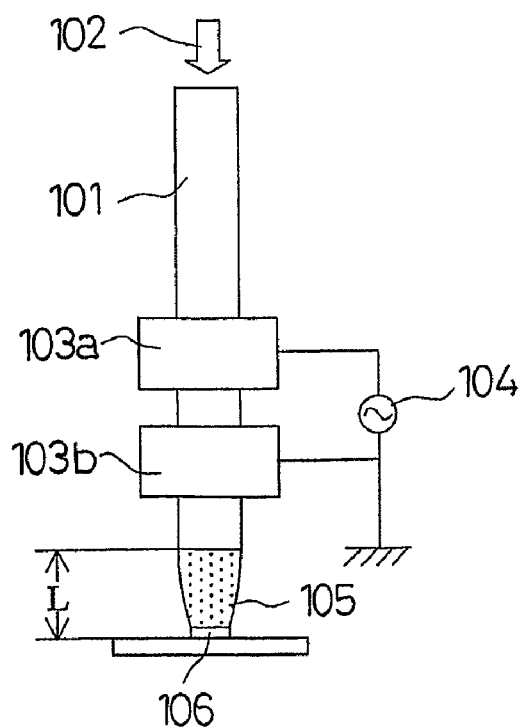
FIG. 22 is a front view of a conventional example 1 according to the conventional atmospheric pressure plasma generating device.
Figure 23:
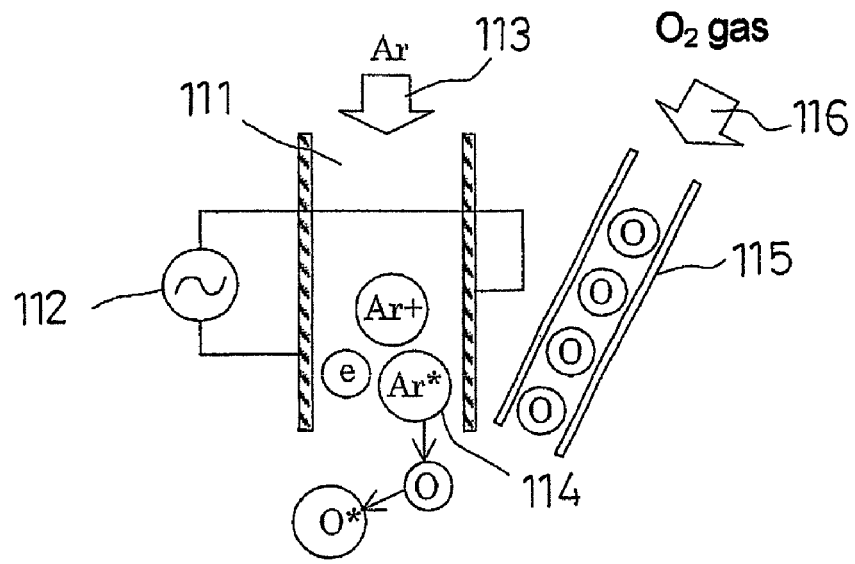
FIG. 23 is an explanatory view of another principle of plasma generation.
Figure 24:
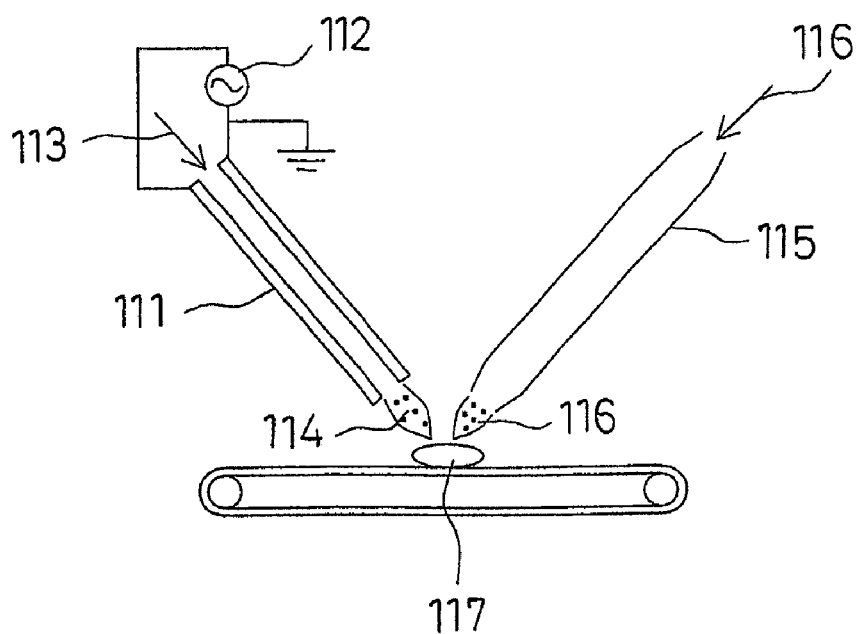
FIG. 24 is a front view of a conventional example 2 according to the conventional atmospheric pressure plasma generating device.
Figure 25:
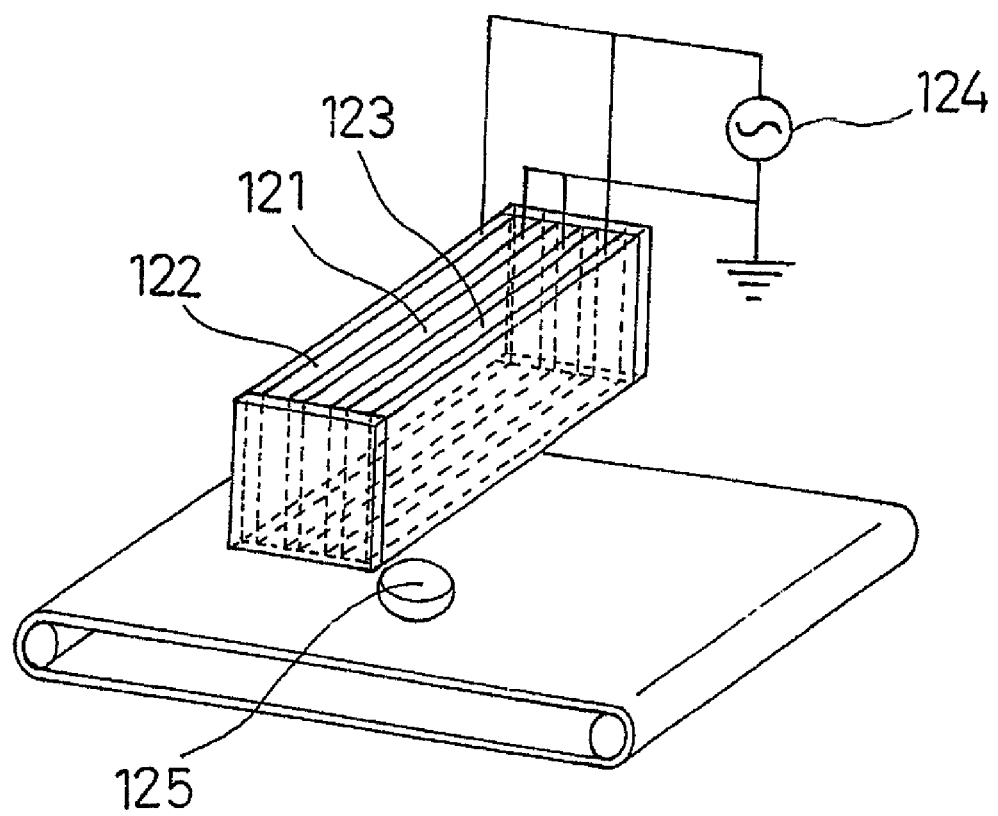
FIG. 25 is a perspective view of a conventional example 3 according to the conventional atmospheric pressure plasma generating device.
Figure 26A:
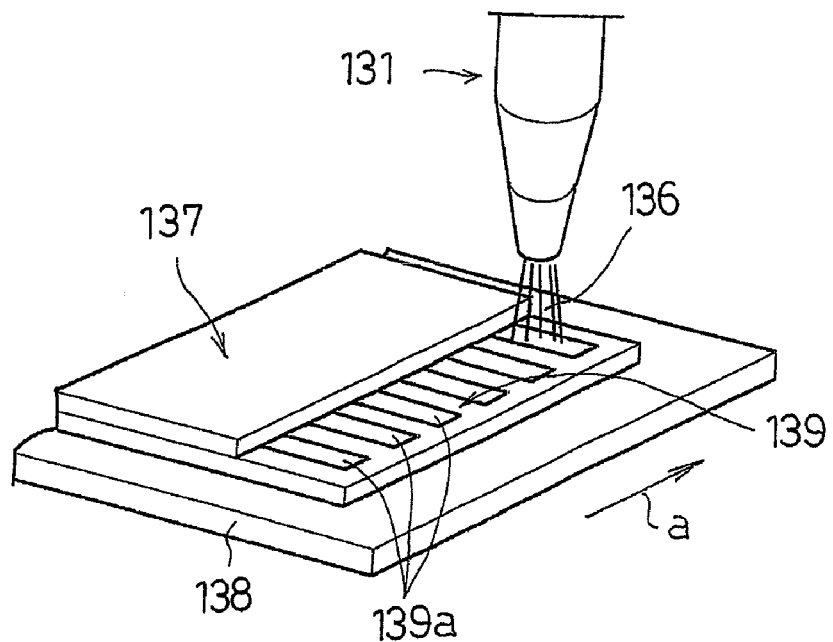
FIGS. 26A to 26B show a conventional example 4 according to a conventional plasma processing method on a contact electrode portion in the liquid crystal panel.
Figure 26B:
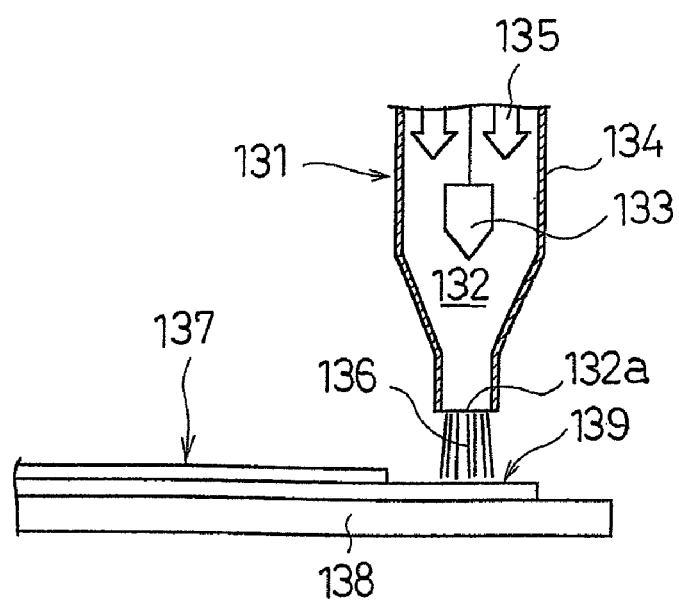

In this embodiment, as shown in FIGS. 20A and 20B, a robot device 85 with a plasma head 50 is disposed over a carrying in and out section (not illustrated) so as not to interfere with anisotropic conductive membrane attaching means 73a of an anisotropic conductive membrane attaching section 73. Thus, the plasma processing section 72 and the anisotropic conductive membrane attaching section 73 are disposed side by side.

In this embodiment, setting the processing tact of the plasma processing process at 3 to 8 seconds can unify each processing tact of the plasma processing section 72 and the anisotropic conductive membrane attaching section 73, the temporary press-fitting section 74, and the final press-fitting section 75 at 8 to 15 seconds. Thus, it is possible to mount the electronic components 79 on the liquid crystal panel 76 with high productivity by compact equipment.

Only an example of mounting the electronic components 79 for driving a flat panel display on the flat panel display such as the liquid crystal panel 76 is described in the foregoing embodiment, but the present invention is not limited to it. When an arbitrary electronic component is mounted on various kinds of substrate, the present invention is preferably applicable to cleaning a component to-be-bonded portion of a substrate and reforming its surface by plasma processing before the component is mounted.

INDUSTRIAL APPLICABILITY

As described above, according to the present invention, a first inert gas is made into a plasma in a reaction space and is ejected as a primary plasma. The primary plasma collides with a mixed gas area of a second inert gas and a reactive gas to cause a plasma reaction with an avalanche multiplication and a secondary plasma largely expands to the whole mixed gas area. Thus, it is possible to carry out a plasma processing in a wide range in a perspective direction and planar direction with respect to the reaction space. An atmospheric pressure plasma which carries out the plasma processing in the wide range is generated by small input power, so that the present invention is suitably usable in an atmospheric pressure plasma generating device. In particular, the present invention can suitably be used in a small atmospheric pressure plasma generating device mounted on a three dimensional robot device.

The invention claimed is:

1. A method for generating an atmospheric pressure plasma, comprising:
    generating a plasma by supplying a first inert gas into a reaction vessel forming a reaction space and applying a high-frequency voltage to an antenna disposed in the vicinity of the reaction space to eject a primary plasma comprising the first inert gas that has been made into an inductively coupled plasma from the reaction space; and
    expanding plasma to form a mixed gas area which contains a second inert gas as a main ingredient and a proper amount of a reactive gas mixed with the second inert gas so that the primary plasma collides with the mixed gas area at a portion lower than a lower end of the reaction vessel in order to generate a secondary plasma comprising the mixed gas that has been made into the plasma and the secondary plasma expands in the mixed gas area, wherein a mixed gas vessel is disposed adjacently to a side of the lower end of the reaction vessel, and a gas inlet disposed in an upper position of the mixed gas vessel supplies the mixed gas to the inside of the mixed gas vessel disposed on the periphery of the reaction vessel.

2. A plasma processing method comprising:
    supplying a first inert gas to a reaction vessel forming a reaction space provided in a plasma head and applying a high-frequency voltage to an antenna disposed in the vicinity of the reaction space to continuously eject a primary plasma from the reaction space;

forming a mixed gas area, which contains a second inert gas as a main ingredient and a proper amount of a reactive gas mixed with the second inert gas, in the plasma head or in the vicinity thereof in order to make the primary plasma collide with the mixed gas area at a portion lower than a lower end of the reaction vessel to generate a secondary plasma and to make the secondary plasma expand in the mixed gas area, wherein a mixed gas vessel is disposed adjacently to a side of the lower end of the reaction vessel, and a gas inlet disposed in an upper position of the mixed gas vessel supplies the mixed gas to the inside of the mixed gas vessel disposed on the periphery of the reaction vessel; and forming the mixed gas area only at a processed portion and generating the secondary plasma when the processed portion is subjected to the plasma processing while relatively moving the plasma head and a processed object in order to carry out the processing by spraying the generated secondary plasma on the processed portion of the processed object.

3. A method for mounting a component on a substrate, comprising:

supplying a first inert gas (5) to a reaction space (1, 24) and applying a high-frequency voltage to an antenna (3) disposed in the vicinity of the reaction space to eject a primary plasma (6) composed of an inductively coupled plasma from the reaction space;

making the primary plasma collide with a mixed gas area (10, 29) which contains a second inert gas (12) as a main ingredient and a proper amount of a reactive gas (13) mixed therewith to generate a secondary plasma (11);

applying the generated secondary plasma to a component to-be-bonded portion (77) of a substrate (76) to carry out a plasma processing; and bonding a component (19) on the component to-be-bonded portion having been subjected to the plasma processing.

4. The method for mounting a component on a substrate according to claim 3, wherein the substrate (76) is a panel for a flat panel display, the component to-be-bonded portion (77) is a connection electrode (82) provided at an end of the panel, the component includes an anisotropic conductive membrane (78) attached on the connection electrode and an electronic component (79) for driving the flat panel display temporarily or finally press-fitted thereon, and a component mounting step includes a plasma processing step, an anisotropic conductive membrane attaching step, a temporary press-fitting step, and a final press-fitting step.

* * * * *